United States Patent
Lell et al.

(10) Patent No.: US 9,130,353 B2
(45) Date of Patent: Sep. 8, 2015

(54) LASER DIODE ASSEMBLY AND METHOD FOR PRODUCING A LASER DIODE ASSEMBLY

(75) Inventors: Alfred Lell, Maxhütte-Haidhof (DE); Martin Strassburg, Donaustauf (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 123 days.

(21) Appl. No.: 13/635,594

(22) PCT Filed: Jan. 31, 2011

(86) PCT No.: PCT/EP2011/051282
§ 371 (c)(1),
(2), (4) Date: Sep. 17, 2012

(87) PCT Pub. No.: WO2011/113638
PCT Pub. Date: Sep. 22, 2011

(65) Prior Publication Data
US 2013/0016752 A1    Jan. 17, 2013

(30) Foreign Application Priority Data
Mar. 17, 2010   (DE) .......................... 10 2010 002 966

(51) Int. Cl.
*H01L 21/00*        (2006.01)
*H01S 5/40*         (2006.01)
(Continued)

(52) U.S. Cl.
CPC ............. *H01S 5/4043* (2013.01); *H01S 5/4087* (2013.01); *H01S 5/0224* (2013.01);
(Continued)

(58) Field of Classification Search
CPC ..... H01S 5/12; H01S 5/343; H01S 2301/176; H01S 5/0224; H01S 5/026; H01S 5/0421; H01S 5/0425; H01S 5/209; H01S 5/2214; H01S 5/2216; H01S 5/3202; H01S 5/3211; H01S 5/32325; H01S 5/32341; H01S 5/3436; H01S 5/4043; H01S 5/4087; H01L 21/20; H01L 31/173; H01L 29/76; H01L 21/8252; H01L 21/182; H01L 21/02381; H01L 21/0262
USPC ........ 372/46.011, 50.1, 50.11, 50.12, 50.124, 372/43.01; 438/25–29, 35–39, 458–459, 438/497–509
See application file for complete search history.

(56) References Cited

U.S. PATENT DOCUMENTS 5,212,706 A *  5/1993  Jain .............................. 372/50.1
5,636,235 A    6/1997  Miyazaki
(Continued)

FOREIGN PATENT DOCUMENTS

DE          101 47 353       4/2003
DE       10 2006 059 700    4/2008
(Continued)

OTHER PUBLICATIONS

D. Bour et al., "Infra-red AlGaAs and Visible AlGaInP laser-diode stack", Electronics Letters, vol. 29. No. 21, Oct. 14, 1993.

*Primary Examiner* — Colleen A Matthews
*Assistant Examiner* — Delma R Forde
(74) *Attorney, Agent, or Firm* — Cozen O'Connor

(57) ABSTRACT

A laser diode arrangement having at least one semiconductor substrate, having at least two laser stacks each having an active zone and having at least one intermediate layer. The laser stacks and the intermediate layer are grown monolithically on the semiconductor substrate. The intermediate layer is arranged between the laser stacks. The active zone of the first laser stack can be actuated separately from the active zone of the at least one further laser stack.

15 Claims, 27 Drawing Sheets

(51) Int. Cl.
*H01S 5/022* (2006.01)
*H01S 5/042* (2006.01)
*H01S 5/20* (2006.01)
*H01S 5/30* (2006.01)
*H01S 5/323* (2006.01)

(52) U.S. Cl.
CPC ............ *H01S 5/0425* (2013.01); *H01S 5/2059* (2013.01); *H01S 5/3095* (2013.01); *H01S 5/32341* (2013.01); *H01S 5/405* (2013.01); *H01S 2301/173* (2013.01)

(56) References Cited

U.S. PATENT DOCUMENTS

| | | |
|---|---|---|
| 5,999,553 A | 12/1999 | Sun |
| 6,144,683 A * | 11/2000 | Floyd ........................ 372/50.12 |
| 6,282,220 B1 * | 8/2001 | Floyd ........................... 372/50.1 |
| 6,829,283 B2 * | 12/2004 | Ebeling ........................... 372/97 |
| 8,089,074 B2 * | 1/2012 | Kim et al. ....................... 257/79 |
| 2001/0002441 A1 | 5/2001 | Boveja |
| 2003/0116767 A1 | 6/2003 | Kneissl et al. |
| 2004/0076209 A1 | 4/2004 | Bour et al. |
| 2004/0215430 A1 | 10/2004 | Huddleston et al. |
| 2007/1023720 | 10/2007 | Ryu et al. |
| 2008/0123710 A1 * | 5/2008 | Brick et al. .................. 372/50.1 |
| 2009/0001389 A1 | 1/2009 | Wang et al. |
| 2012/0287958 A1 * | 11/2012 | Lell et al. ................... 372/45.01 |

FOREIGN PATENT DOCUMENTS

| | | |
|---|---|---|
| GB | 1 046 702 | 10/1966 |
| JP | 61 206285 | 9/1986 |
| WO | WO 2006/051272 | 5/2006 |

\* cited by examiner

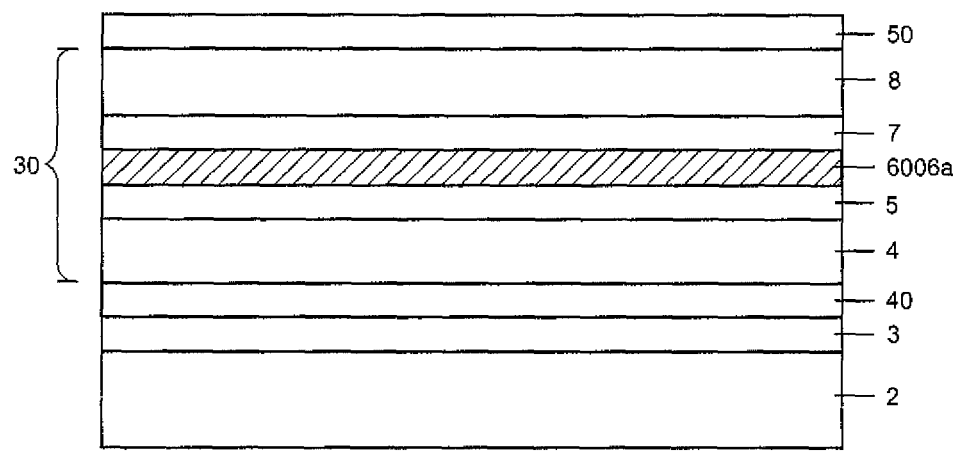
FIG 1.1
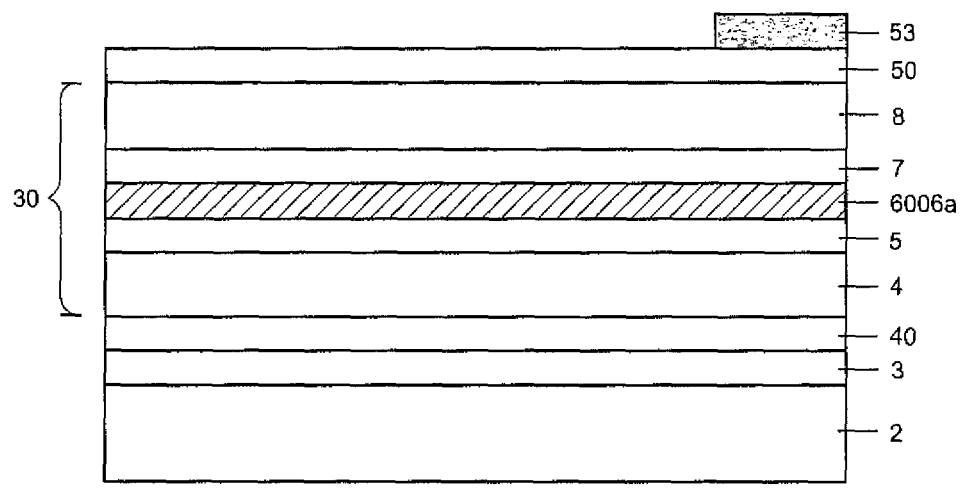
FIG 1.2

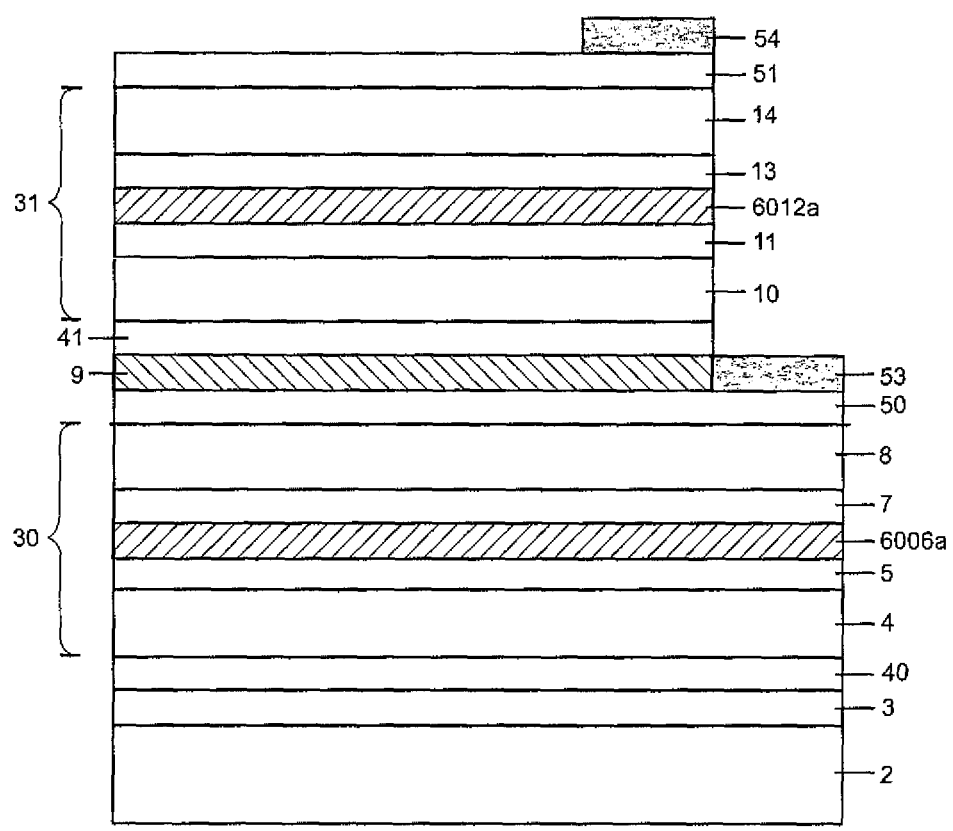
FIG 1.3

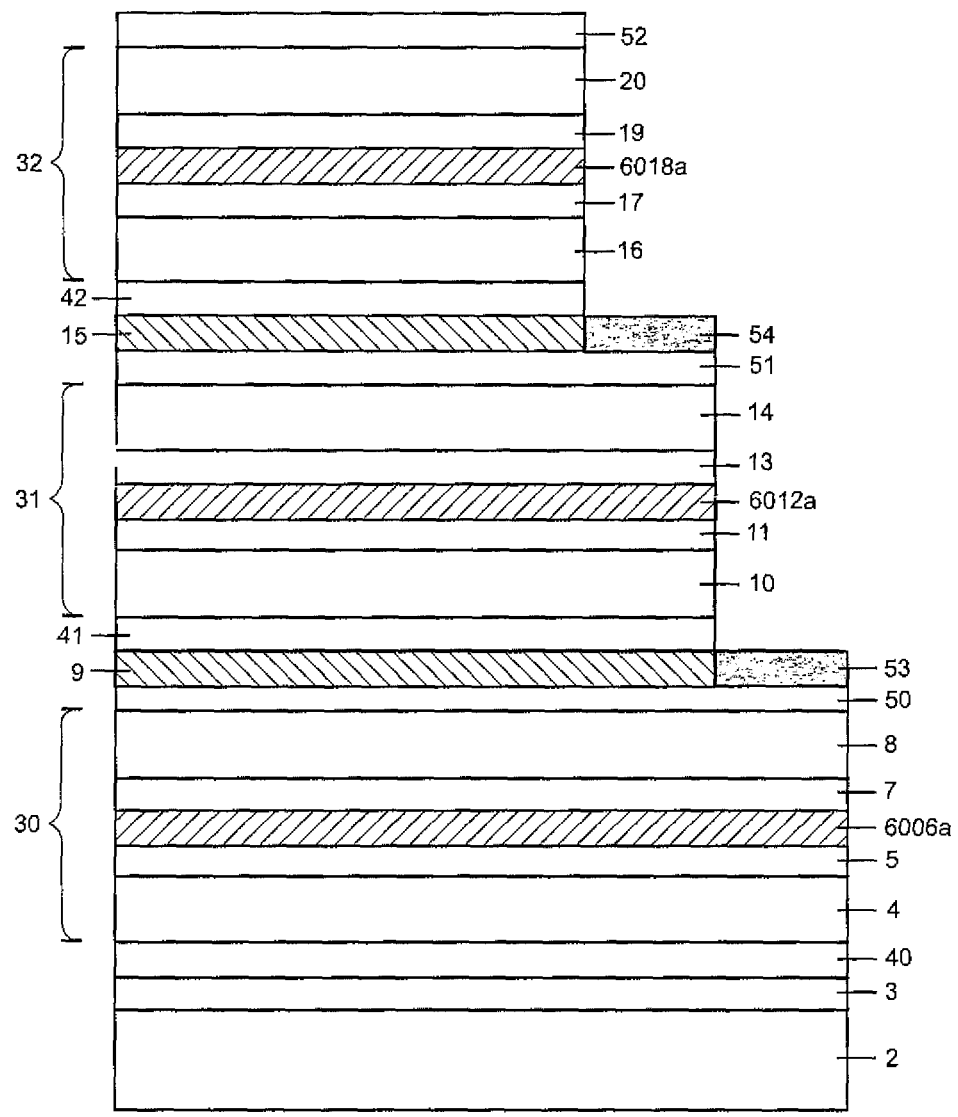
FIG 1.4

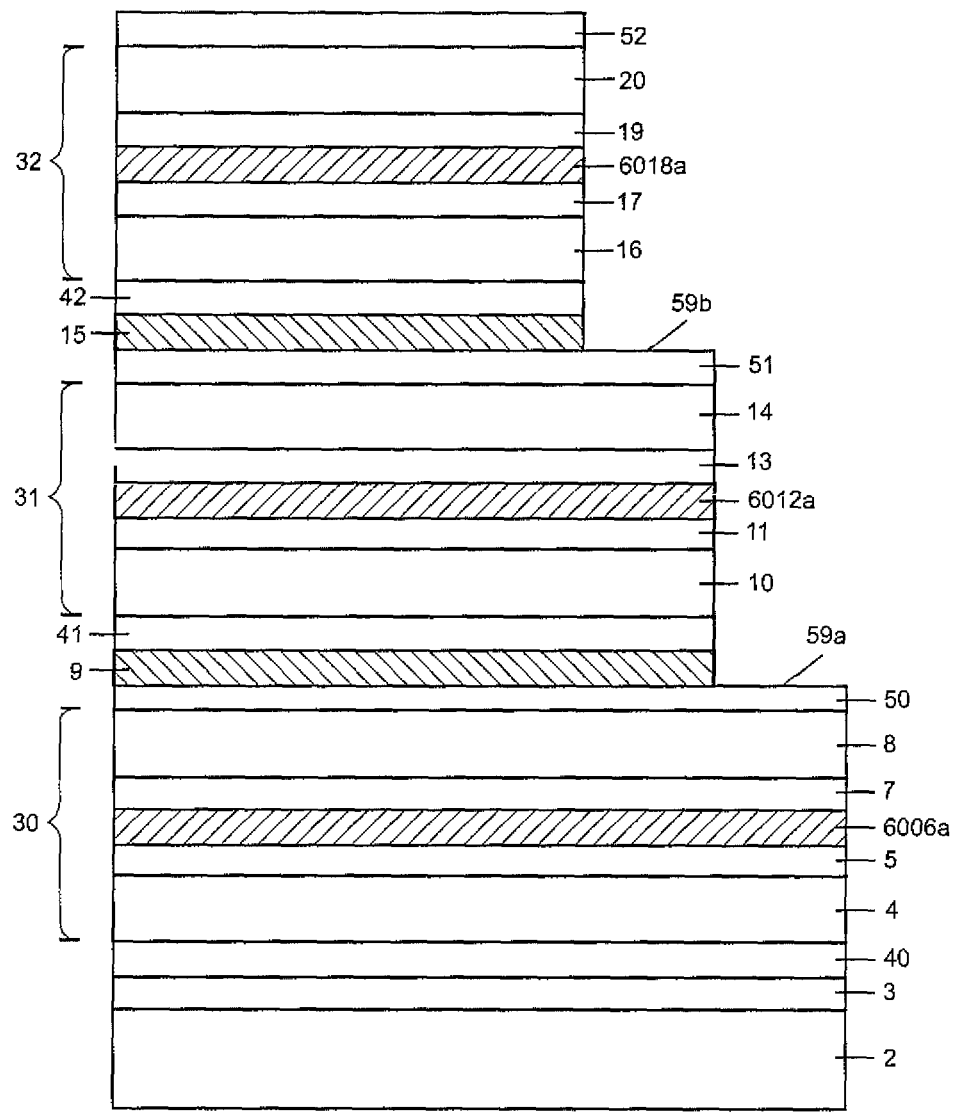
FIG 1.5

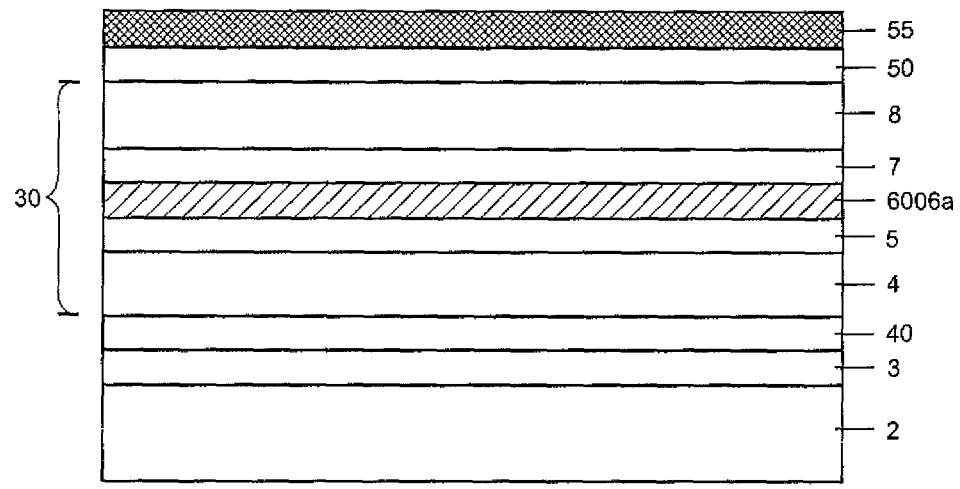
FIG 2.1
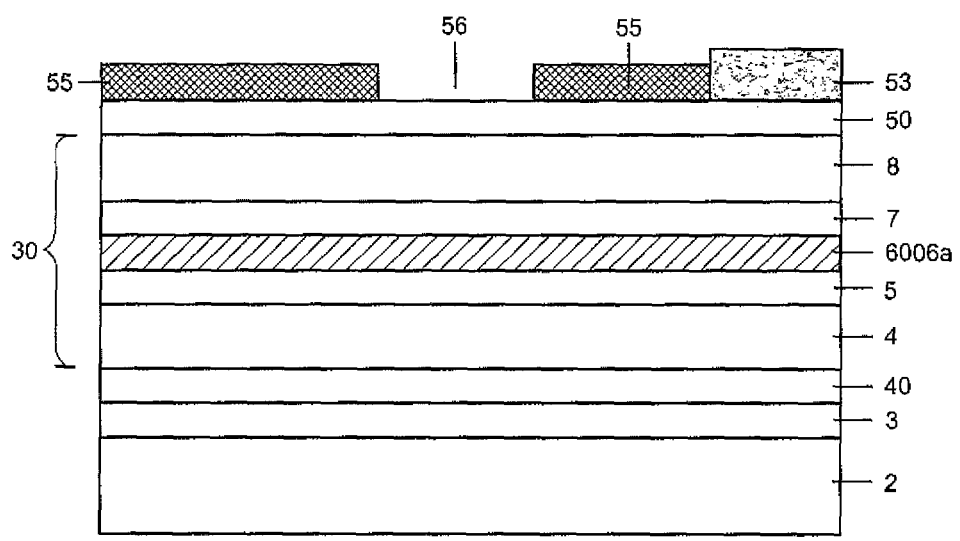
FIG 2.2

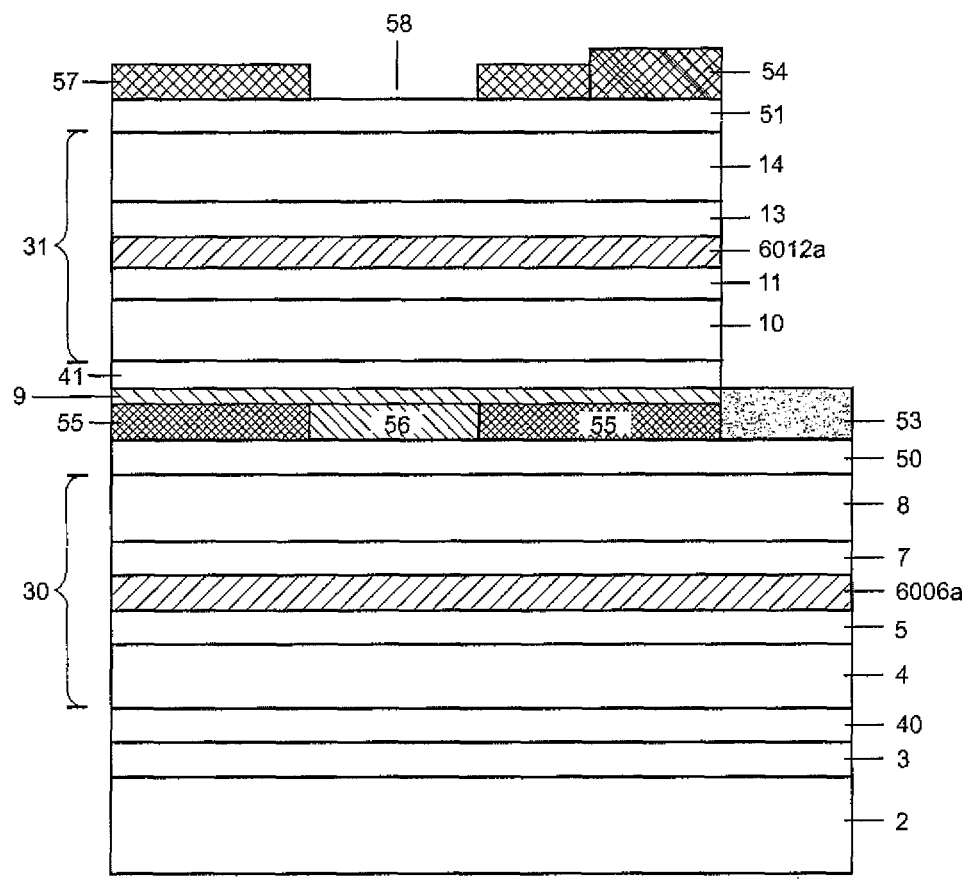
FIG 2.3

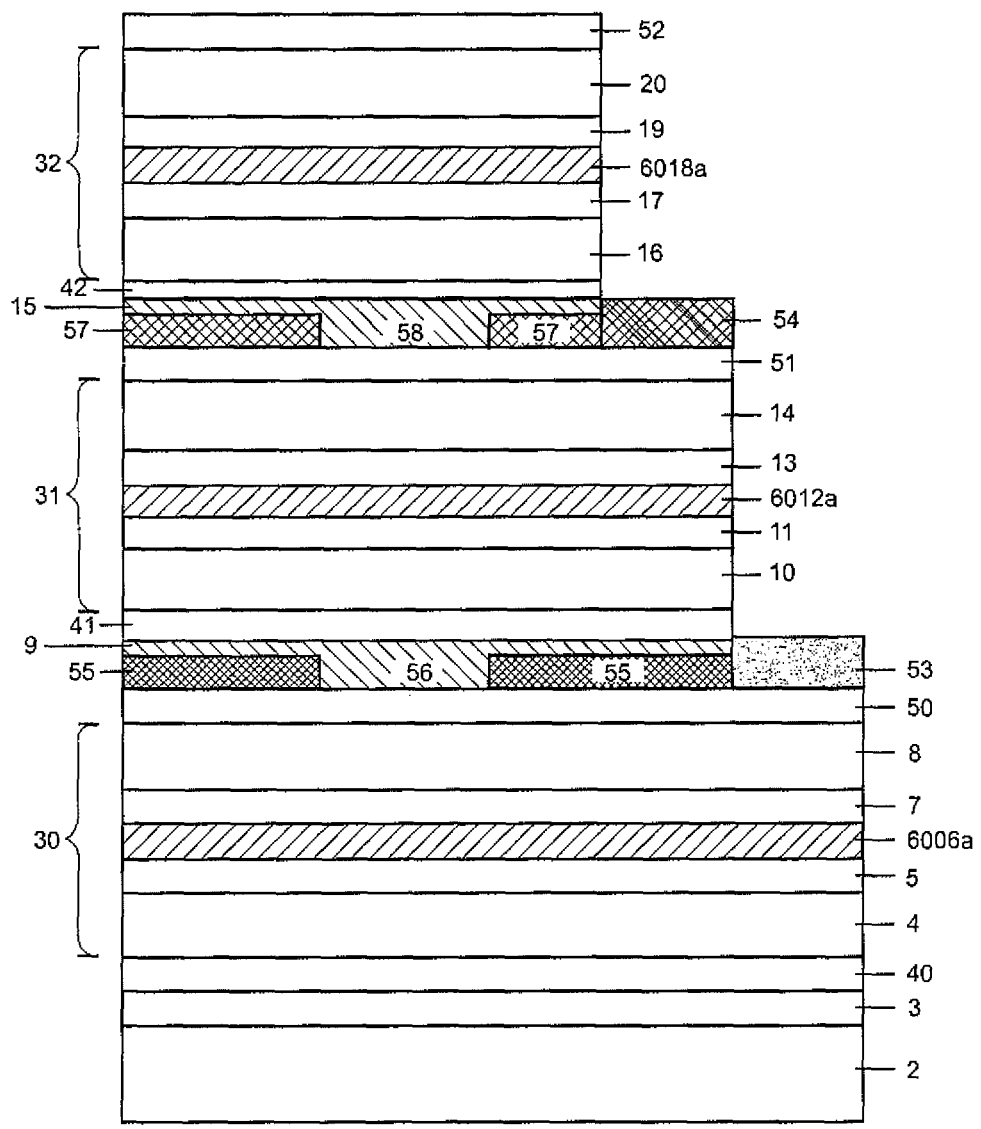
FIG 2.4

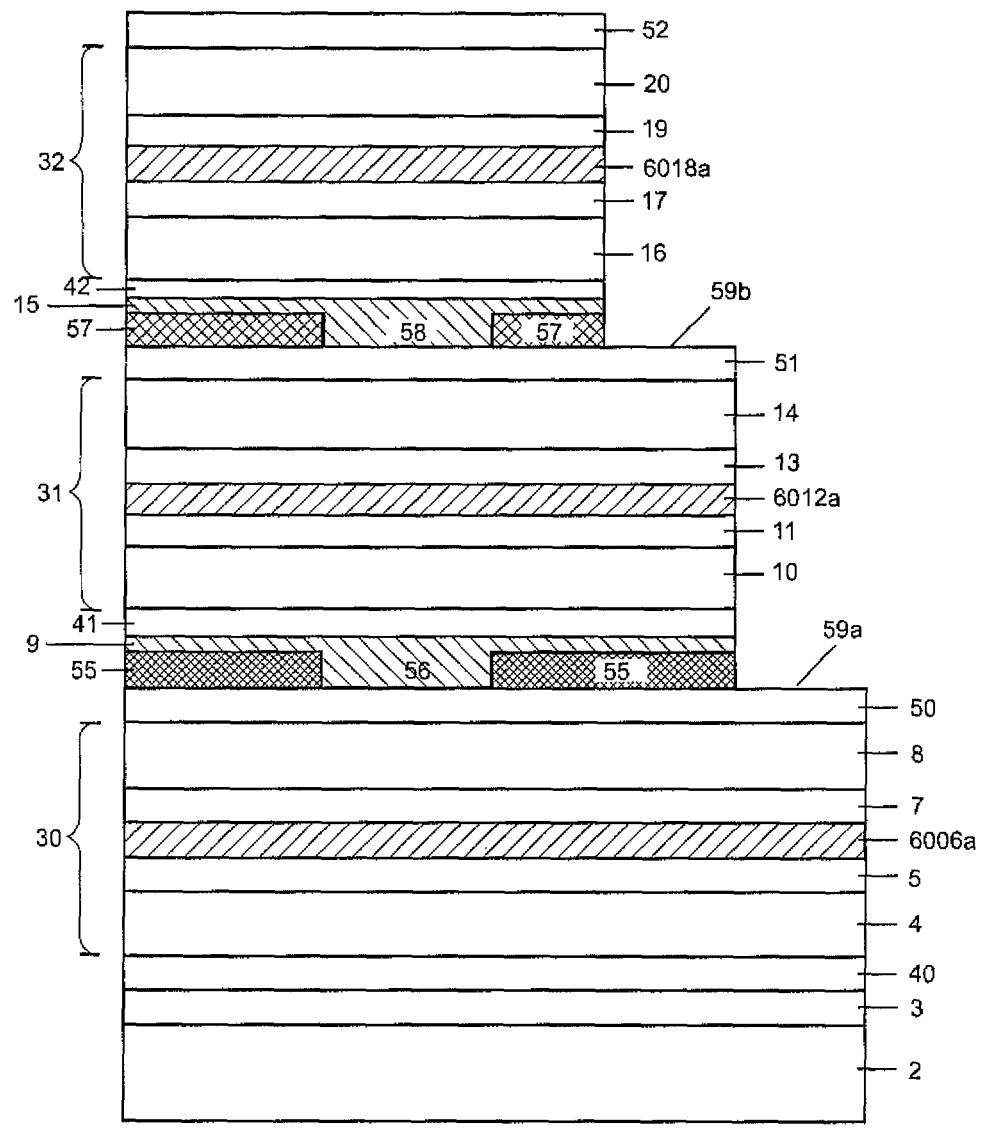
FIG 2.5

LASER DIODE ASSEMBLY AND METHOD FOR PRODUCING A LASER DIODE ASSEMBLY

RELATED APPLICATIONS

This is a U.S. National Phase Application under 35 USC 371 of International Application PCT/EP2011/051282 filed on Jan. 31, 2011.

This application claims the priority of German Application No. 10 2010 002 966.1 filed Mar. 17, 2010, the content of which is hereby incorporated by reference.

FIELD OF THE INVENTION

The present invention relates to a laser diode arrangement having a semiconductor substrate, having laser stacks and intermediate layers between the laser stacks. Furthermore, a method for producing a laser diode arrangement is specified.

BACKGROUND OF THE INVENTION

In the prior art, current is applied uniformly to laser diodes of a laser diode arrangement. This means that the light outputs of the different laser diodes of the laser diode arrangement cannot be varied independently of one another.

SUMMARY OF THE INVENTION

Different embodiments have a laser diode arrangement having at least one semiconductor substrate. At least two laser stacks each having an active zone and having at least one intermediate layer are provided. The laser stacks and the intermediate layers area are grown monolithically on the semiconductor substrate. The intermediate layers are arranged between the laser stacks. The active zone of the first laser stack can be actuated separately from the active zone of the at least one further laser stack.

The semiconductor substrate can be a III-V compound semiconductor material, in particular a nitride compound semiconductor material such as gallium nitride (GaN) and aluminum nitride (AlN). Alternatively, gallium arsenide (GaAs), silicon carbide (SiC) or sapphire can be employed as the substrate.

Silicon (Si) can also be used as the semiconductor substrate.

The active zones can be pn junctions, double heterostructure, multiple quantum well structure (MQW), single quantum well structure (SQW). Quantum well structure means: quantum wells (2-dim), quantum wires (1-dim) and quantum dots (0-dim). The current is injected into the active zone through a p-doped layer and through an n-doped layer.

As described above, the active zone can be a multiple quantum well structure. It consists of a plurality of active layers. A barrier layer lies between the active layers in each case. Diffusion barriers reduce the danger of p-dopant of the p-doped confinement layer penetrating into the active zone.

In each case a further barrier layer precedes the first active layer and follows the last active layer in the growth direction. The active layers contain or consist of InGaN and are between about 0.8 nm and about 10 nm thick. The barrier layers contain or consist of $Al_xIn_yGa_{(1-x-y)}N$ where $0 \le (x+y) \le 1$ and/or GaN and are between 1 and 200 nm thick.

The monolithic growth means that the plurality of laser stacks are grown in succession on the same wafer. In particular, no laser bars are mounted one above the other by soldering or adhesive means.

In the present invention, the layer sequences are grown onto one another by means of molecular beam epitaxy or metal organic vapor phase epitaxy or vapor phase epitaxy or liquid phase epitaxy.

The monolithic growth of the laser stacks is advantageous because it means that particularly small spacings of the active zones and the laser diodes which can be formed from them can be implemented. Without monolithic growth, arrangements consisting of laser diodes would be restricted to a minimum vertical spacing of the laser diodes from one another of about 100 µm. This minimum spacing derives from the minimum thickness to be processed of the laser diode structures. This wide spacing of the laser diode structures arranged vertically above one another limits the maximum optical power density which can be achieved and also the etendue.

The laser diodes from different active zones can be actuated separately. This means that in addition to the intensity, it is also possible to dynamically alter the color point of the emitted radiation.

In a preferred embodiment of the invention, the active zones are actuated through separate n-contacts and separate p-contacts. In this situation, in order to generate the primary colors blue, green and red each active zone is connected to a separate n-contact and a separate p-contact. The laser stacks are connected to one another by way of an intermediate layer. This results in flexibility as desired in regard to contacting the single light sources and the parasitic co-illumination of other light sources in the laser stack is avoided.

In a further preferred embodiment of the invention, the active zones are actuated through a common p-contact and separate n-contacts. The common p-contact is preferably deposited on a passivation layer and the region of a heavily doped p-contact layer freed from the passivation layer. The space requirement is reduced on account of the separate p-contact surfaces being dispensed with, which means that components which are more compact are possible. There is a smaller space requirement on the semiconductor wafer, which means that the projection light sources can be produced more cost-effectively. The layer construction is optimized in regard to parasitic illumination if the band gap of the active zones in the layer construction increases from bottom to top, in other words the wavelength of the emitted laser light decreases. A further advantage is the fact that the assembly effort is reduced.

In a yet more preferred embodiment of the invention, the active zones are actuated through a common n-contact and a plurality of separate p-contacts. The common n-contact is preferably deposited on the substrate underside. As already in the case of the common p-contact, the space requirement is reduced. This time, however, as a result of the fact that the separate n-contact surfaces are dispensed with. This makes possible components which are more compact. Moreover there is a smaller space requirement on the semiconductor wafer, which means that more cost-effective manufacturing is possible. The layer construction is optimized in regard to parasitic illumination if the band gap of the active zones decreases from bottom to top, in other words the wavelength of the emitted laser light increases. A further advantage is the fact that the assembly effort is reduced.

It holds true for all embodiments that the separate n-contacts are in each case deposited on a highly n-doped contact layer. The separate p-contacts are in each case deposited on a highly p-doped contact layer.

In a preferred embodiment, each laser stack with the associated active zone has at least one laser diode.

In a preferred embodiment of the laser diode arrangement, the intermediate layer is an ohmic resistance. The ohmic contacts can be implemented as a tunnel diode by means of a monolithic process. The tunnel junction is also deposited during the epitaxial growth of the laser structures. It serves to provide the electrical connection. The tunnel junction comprises two highly doped layers of different conductor types (n-type or p-type). These two layers are separated from one another by means of at least one undoped intermediate layer, for example consisting of $Al_xIn_yGa_{(1-x-y)}N$ where $0 \leq (x+y) \leq$. The tunnel junction serves to provide the electrical connection for two laser stacks. The laser diodes are connected electrically in series by the tunnel junctions. The tunnel junction or junctions form particularly small potential barriers. This facilitates the tunneling of charge carriers between active zones lying on top of each other.

In the growth direction, the following layer sequence can for example result in the tunnel junction:
$p^+$-type tunnel junction layer
middle layer
$n^+$-type tunnel junction layer.

In an alternative embodiment, the middle layer can be dispensed with in the tunnel junction. The next laser diode in the stack then follows.

The $p^+$-type and/or $n^+$-type tunnel junction layer can be designed as a superlattice. The band gap is smaller in the region of the middle layer than in the region of the n-type barrier and p-type barrier.

The spatial distance between the regions of high charge carrier densities (electrons and holes) is small: The tunnel junction has a particularly low electrical resistance. At the same time, a high charge carrier density and thus a high tunnel probability can be achieved.

Midgap states in the middle layer of the tunnel junction (can consist of a homogeneous substance or of: n+-type tunnel junction layer and middle layer and p+-type tunnel junction layer) are caused by impurity atoms, in particular rare earths and/or transition metals.

In contrast to the usual dopants (Si, Mg), such impurity atoms have the advantage that they create electronic states which are ordered energetically approximately in the center of the band gap of the tunnel diode intermediate layer.

Said impurities make it easier for the charge carriers to tunnel through the tunnel diode intermediate layer. By this means, the efficiency of the tunnel junction is improved compared with a tunnel junction without specifically incorporated impurities.

When the semiconductor body has no tunnel junction, the charge carriers must overcome high energetic potential barriers during the transition from the n-type confinement layer into the active zone or from the p-doped confinement layer into the active zone. In the case of a semiconductor body having a tunnel junction, such potential barriers do not occur or scarcely occur.

The danger of a non-radiative recombination of electrons is reduced, which particularly in the case of high operating currents, in other words in the case of high charge carrier concentrations, increases the efficiency.

With regard to semiconductor bodies having no tunnel junction and having a multiple quantum well structure, only one of the active zones contributes to the emission.

The tunnel junction makes it possible to produce the two opposite contacts of the semiconductor chip from n-type semiconductor material. It is thereby possible to avoid the problem of the low p-type conductivity of nitride compound semiconductors.

Further advantages of a tunnel layer are as follows:
Only a few contacts are required, namely in the ideal situation only two for the entire laser diode arrangement. The tunnel layer is extremely thin, namely about 30 nm, in particular thinner than an alternative insulating layer. A maximum degree of compactness is therefore possible with tunnel diodes. In other words, an ohmic contact is formed between the laser diodes with minimum dimensions.

In a further embodiment, wherein the tunnel junction is situated in the waveguide layer, the monolithically grown tunnel junction is translucent. This is particularly advantageous because in the region of the laser wavelength the ohmic contact exhibits no or only extremely slight optical absorption. The laser radiation is advantageously scarcely attenuated prior to exiting from the laser diode arrangement.

In a further embodiment of the laser diode arrangement, the intermediate layer exhibits insulating properties. The insulating layer can be formed by means of ion implantation or by epitaxial growth of a crystalline electrically insulating layer. The advantage of the crystalline layer is that the crystalline information is not lost during the further growth process. This results in a buffer layer having good crystalline quality for overlying layers. There are fewer crystal defects and no new nucleation is required. This means that completely independent control of the individual active zones with the laser diodes formed from them becomes possible. The insulating layer is completely transparent to the laser light. No diffusion of photons or absorption of charge carriers and photons takes place. Two variants of the insulating layer are advantageous. According to the first variant, the insulator is grown with intrinsically high purity with an impurity concentration of less than $10^{17}$ cm$^{-3}$, preferably less than $10^{16}$ cm$^{-3}$ and especially preferably less than $10^{15}$ cm$^{-3}$. According to the second variant, the semiconductor crystals are doped with special dopants which destroy the conductivity of the crystals. In other words, deep centers are produced.

Both the ohmic resistance in the form of a tunnel diode and also the insulator in the form of a crystalline electrically insulating layer act as the substrate and have the same function as a substrate in this situation. In other words, they form a good crystalline base for the subsequent epitaxially grown laser stacks. In a preferred manner, the intermediate layer in the form of a tunnel diode or a crystalline, electrically insulating layer is very similar to the subsequent laser stacks in respect of the lattice properties and the thermal properties.

In a further embodiment, a thin transparent conductive oxide (TCO) layer can be employed as an intermediate layer. In particular, zinc oxide and indium tin oxide (ITO) are advantageous. The TCO layer exhibits a high electrical conductivity and a suitable transparency for the occurring laser wavelengths. The TCO layer can be produced in sufficiently good quality using standard methods such as for example CVD, sputtering or also MOVPE.

In a preferred embodiment, the active zones are designed such that laser diodes from different laser stacks emit electromagnetic radiation in wavelength ranges differing from one another. In the case of a III-V compound semiconductor system, in particular an InGaN system, as a result of variation of an indium concentration in the active zones at least one first laser diode can emit electromagnetic radiation in the blue to UV spectral range, at least one second laser diode can emit electromagnetic radiation in the green to yellow spectral range and at least one third laser diode can emit electromagnetic radiation in the red spectral range. It is advantageous in this situation that laser diodes having different emission spectra are grown monolithically, in other words in a single semiconductor system. The single light sources belonging to each active zone may be present in any sequence. Preferred however are stack sequences wherein the most temperature-sensitive layers are grown last, in other words as the uppermost layer. In the event that red, green and blue single light sources are grown based on the AlInGaN material system, it is advantageous to grow the indium-richest red active zone on last.

In preferred embodiments, the active zones in an AlInGaN material system exhibit the following indium concentrations:
in the UV range, between about 5% and about 10%,
in the blue range, between about 15% and about 25%,
in the green range, between about 25% and about 35%,
in the yellow range, between about 35% and about 45% and
in the red range, greater than about 45%, preferably between 45% and 60%.

In a preferred embodiment of the invention, the laser diode arrangement is based on two light sources, different laser stacks being grown on two different semiconductor substrates.

For example, an AlInGaN system is grown on a first substrate, e.g. a GaN substrate. Active zones for the efficient emission of blue and green laser light can thereby be produced. For example, an InGaAlP system is grown on a second substrate, e.g. a GaAs or GaP substrate. Active zones for the efficient emission of yellow to red laser light can thereby be produced. The two light sources which are grown on the two different substrates can be arranged close to one another. The monolithically grown light sources can be arranged beside and/or above one another. The main advantage consists in increasing the number of colors and thus in enabling the greatest possible adaptation to the theoretically displayable color space. For example, a red light source grown on a GaAs substrate can be bonded onto a blue and green emitting light source. In this situation the metallizations are connected to one another by way of a solder layer. The active zones from the two different systems exhibit a spacing of preferably about 10 μm, especially preferably of less than about 5 μm. It is thus possible to achieve spacings such as are achieved in the case of purely monolithic growth without a combination of two light sources based on two different semiconductor substrates. This growth on two different substrates with subsequent connection of the two light sources is particularly cost-effective. This combination of a separately grown red emitting light source with a separately grown light source, with laser emission in the green and blue, is suitable for applications such as projection, retina scanning display using pocket projectors, laser TV, video projectors and movie projectors.

In a preferred embodiment of the laser diode arrangement, the laser diodes are stacked vertically with respect to the semiconductor substrate. A monolithic growth process means it is possible to achieve a vertical spacing between the laser diodes of less than about 20 μm. By preference, the vertical spacing is less than about 5 μm and especially preferably less than about 2 μm.

In a preferred embodiment, the laser diodes are arranged horizontally, or in other words parallel, with respect to the semiconductor substrate. A monolithic growth process means it is possible to achieve a horizontal spacing between the laser diodes of less than about 100 μm. Preferably the horizontal spacing is less than about 20 μm and especially preferably less than about 5 μm.

The small spacings of the monolithically grown laser diodes, which lie in the order of magnitude of the emission wavelength of the electromagnetic radiation, are particularly advantageous because this means that the light from different laser diodes can be emitted coherently both temporally and spatially with respect to one another. The individual laser diodes are placed so close together that the wave fields overlap. This is possible below a spacing of the laser diodes of about 15 μm. In this case, a phase coupling of the individual emissions takes place such that a coherent radiation similar to a single laser can be emitted. This results in further degrees of freedom and capabilities for the interaction between the light waves. This means that it is possible to achieve a particularly sharp projection image. The compactness of the laser diode arrangement means that it can be used in glasses (retina scanning display), mobile telephones, smartphones, PDAs or netbooks (pocket projectors).

The laser diodes can be arranged in a two-dimensional structure. Mode sweeping, mode amplification and mode suppression come into consideration as an interaction between light waves from different laser diodes.

Advantageous properties of the present monolithic laser diode structure are the high optical power density with simultaneously reduced dimensions of the laser diode structure. This permits the use of less complicated optical imaging systems, in other words for example a simple lens or a simple lens system. Better imaging properties additionally result. The emission takes place from a laser light source, emitting largely in centric fashion, having an aspect ratio close to 1.

Advantages in the imaging behavior result from this. In a particularly advantageous manner the present invention can be used for producing extreme luminances.

Advantageous furthermore are the low production costs (epitaxy, processing and packaging) for the monolithically integrated laser diode arrangements in comparison with the construction of conventional laser arrays having equally strong emission.

In a preferred development of the invention, the layer facing the semiconductor substrate, which layer adjoins the active zone, is an n-waveguide and the layer facing away from the semiconductor substrate, which layer adjoins the active zone, is a p-waveguide. In other words, in the growth direction the substrate is followed by an n-layer, then comes an active zone and then in turn a p-layer. This sequence is also referred to as conventional polarity. The deposition of the layer sequence can be repeated multiple times. It is advantageous that this epitaxial structure allows particularly small spacings to be implemented between the laser diodes. Monolithically grown components having the above layer sequence can be operated at high voltages but a low actuation current. At low current densities however the undesired quantum-confined Stark effect occurs which distorts the active zone. This results in a poor overlap of the wave functions of the charge carriers in the laser active zones. Consequently there is a high probability of non-radiative recombination.

It is advantageous if the layer facing the semiconductor substrate, which layer adjoins the active zone, is a p-waveguide and the layer facing away from the semiconductor substrate, which layer adjoins the active zone, is an n-waveguide. In other words, in the growth direction the substrate is followed by a p-layer, then comes an active zone and then in turn an n-layer. In this context one also speaks of inverted polarity or polarity inverted laser diode (PILD). The laser diode arrangement having the above layer sequence can be operated at high voltages and a low actuation current. The internal piezoelectric field occurring in the case of inverted polarity compensates at least partially for other fields, such as for example external fields, and thus contributes towards reducing the quantum-confined Stark effect which occurs in particular in crystals having a polar wurztite structure, such as GaN. This results in improved charge carrier injection into the active zone; more charge carriers can be trapped in the active zone. The internal quantum efficiency is then only slightly dependent on the current density. Furthermore, as a result of the lesser transverse conductivity of the p-layers in comparison with the n-layers the undesired lateral current spreading is significantly reduced. The electrical losses are reduced. The lesser transverse conductivity of the p-layers is explained as follows: In comparison with n-layers the p-layer is high impedance. The p-layer is doped with Mg atoms (acceptor) and the n-layer is doped with Si atoms (donor). Doping with Mg atoms at $\sim 10^{20}$ cm$^{-3}$ results in a hole concentration of only $\sim 10^{18}$ cm$^{-3}$.

The lateral current spreading results in an undefined current- and power-dependent broadening of the current injection. The consequence is an uncontrolled broadening of the luminous spots and thus a reduced luminance. The operating current must be increased because otherwise no population inversion is achieved at the edge of the undefined, current broadened region.

In a preferred embodiment of the invention, current shields are provided between the laser stacks. These current shields counteract the current spreading within the monolithically grown laser light source. Through the use of current shields it is possible to achieve a situation where a monomode operation can be achieved across the entire monolithic layer system comprising at least two active zones. The current shield can be produced by incorporating one or more insulation layers into the layer system and structuring the insulation layer. Alternatively, a current shield can be produced by means of ion implantation or by partially etching away the contact layer.

Projection systems currently in common use are based on LCD or plasma technology or on projectors and video projectors using high-pressure lamps. All these traditional display technologies exhibit a high power consumption, a very restricted color space and an extremely limited service life. Above all, however, the lack of compactness precludes use in mobile applications such as for example in mobile telephones and in PDAs.

Although RGB projectors based on LED technology overcome some disadvantages of traditional display systems, it is however possible when using LED projectors to realize sharp projection images only on plane surfaces arranged exactly perpendicular to the projection unit. In addition, complex micro-optical systems and imager technologies are required and, in addition to increased costs for the overall system, also result in significantly increased dimensions of the LED-based RGB projectors. A further serious disadvantage of said LED-based RGB projectors compared with laser-based RGB projectors according to the invention is the fact that the single light sources arranged beside one another for design reasons exhibit a minimum spacing of several hundred μm. This results on the one hand in imaging errors and thus precludes the highest resolutions. It furthermore renders more difficult the imaging by a single lens system, which limits the compactness of the light source.

Although laser projectors available today solve the problem of depth of focus and imaging on a not exactly plane surface, they are however not capable of forming ultracompact RGB laser light sources on account of the less than compact dimensions principally of the green laser (green is produced by means of frequency multiplication).

According to an embodiment of the present invention, through suitable choice of the layer sequences and by using appropriate contacting technologies, the single light sources of the projection light source can be actuated individually. This means that imaging errors can be minimized without losing the advantage of a considerably increased depth of focus compared with conventional LED projectors. In this situation the imaging can be realized by means of lenses situated very close to one another or a common lens system, which means that the monolithically grown projection light source is particularly cost-effective and compact.

Another aspect of the invention relates to a method for producing a laser diode arrangement comprising the following steps.

At least one semiconductor substrate is provided. A first single light source comprising a first laser stack, a first n-contact layer and a first p-contact layer is subsequently produced by means of epitaxial growth. Then a first dielectric layer is deposited on the first p-contact layer. An intermediate layer is deposited on the first p-contact layer. A second single light source, comprising a second laser stack, a second n-contact layer and a second p-contact layer is grown epitaxially. Then a second dielectric layer is deposited on the second p-contact layer. The two dielectric layers are subsequently removed in order to expose contact surfaces. Contacts are deposited on the exposed contact surfaces and on the exposed contact layer furthest away from the substrate. This method is particularly advantageous because self-adjusting exposure of the contact surfaces is possible in this situation.

The dielectric layer, which serves as a passivation layer, can be deposited over the entire surface and subsequently structured or can alternatively be structured using lift-off technology.

In a preferred development of the method, after the step of growing a single light source and before the step of depositing a dielectric layer on a partial region of the p-contact layer the following steps are carried out: Firstly, an insulation layer is grown on the contact layer. The insulation layer is subsequently partially exposed by means of etching or lift-off. This development is preferably used when incorporating a current limiting layer.

As an alternative to the method described above, the overall layer stack can be grown entirely epitaxially. The contact surfaces are subsequently exposed by means of phototechnology and etching technology. The contact metallization is then deposited and structured by means of photolithography or lift-off technology. The advantage of this method is that it requires few epitaxy steps.

Laser light in laser diodes can propagate in index-guided and/or gain-guided fashion.

In a preferred development of the invention, the laser diode arrangement has laser ridges which serve to guide the laser radiation. In this situation, the active region is limited laterally to one strip by refractive index jumps. The optical wave is guided in a waveguide. The design of the waveguide can be achieved by means of different layer thicknesses and/or layer sequences. In this situation, different effective refractive indices result inside and outside the strip. In order to improve the electrical confinement, the contact is additionally designed as a strip. The advantage of index-guided laser diodes in comparison with gain-guided laser diodes is the low threshold current. By way of the width of the laser ridges it is possible to control whether only one mode is oscillating (ridge widths of less than about 2 μm) or whether a multimode operation is taking place.

Only gain-guided systems are illustrated in the exemplary embodiments described in the following. Index-guided systems can however be described in an analogous manner.

BRIEF DESCRIPTION OF THE DRAWINGS

Different exemplary embodiments of the solution according to the invention will be described in detail in the following with reference to the drawings.

FIGS. 1.1 to 1.5 show the intermediate products of the first production process from FIG. 1;

FIGS. 2.1 to 2.5 show the intermediate products of the second production process from FIG. 2;

DETAILED DESCRIPTION OF THE DRAWINGS

Figure 1:
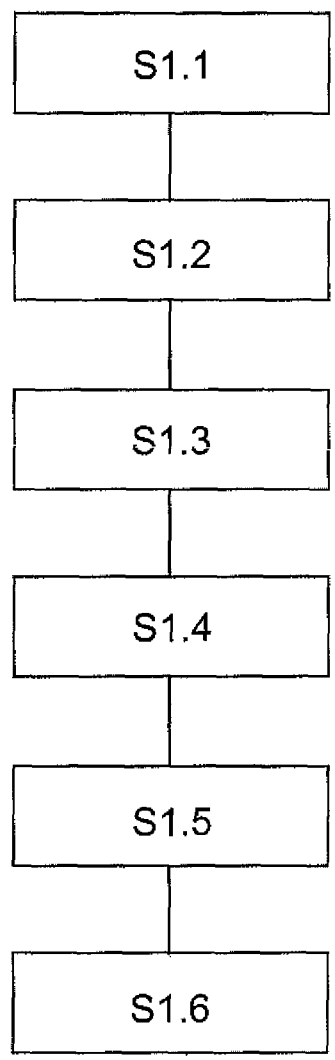
FIG. 1 shows the flowchart for a first production process.

The same elements or elements of the same type or having the same function are identified by the same reference characters in the figures. The figures and the relative proportions of the elements represented in the figures should not be regarded as to scale. Rather, individual elements can be represented exaggerated in size in order to enhance presentation and for better understanding.

FIG. 1 shows a first flowchart for producing a laser light source. The first production process can be subdivided into the steps S1.1 to S1.6.

In step S1.1, a semiconductor substrate 2 is provided with a buffer layer 3. A single light source is grown epitaxially thereon. The single light source comprises a laser stack 30, a first n-contact layer 40 and a first p-contact layer 50. In the growth direction the laser stack 30 consists of a first n-cladding layer 4, a first n-waveguide 5, a first active zone 6006a, a first p-waveguide 7 and a first p-cladding layer 8.

The result of step S1.1 is illustrated in FIG. 1.1.

In step S1.2, a first dielectric layer 53 is deposited on a partial region of the first p-contact layer 50.

The result of step S1.2 is illustrated in FIG. 1.2.

In step S1.3, a first tunnel diode 9 is deposited on the first p-contact layer 50. On this is grown a second single light source, comprising a second n-contact layer 41, a second laser stack 31 and a second p-contact layer 51. A second dielectric layer 54 is deposited on the second p-contact layer 51. In the growth direction the second laser stack 31 comprises a second n-cladding layer 10, a second n-waveguide 11, a second active zone 6012a, a second p-waveguide 13 and a second p-cladding layer 14.

The result of step S1.3 is illustrated in FIG. 1.3.

In step S1.4, a second tunnel diode 15 is grown on the second p-contact layer 51. On this is grown a third single light source, comprising a third n-contact layer 42, a third laser stack 32 and a third p-contact layer 52. In the growth direction the third laser stack 32 comprises a third n-cladding layer 16, a third n-waveguide 17, a third active zone 6018a, a third p-waveguide 19 and a third p-cladding layer 20.

The result of step S1.4 is illustrated in FIG. 1.4.

In step S1.5, the first dielectric layer 53 and the second dielectric layer 54 are removed.

The result of step S1.5 is illustrated in FIG. 1.5, wherein can be seen the first exposed contact surface 59a and the second exposed contact surface 59b.

In step S1.6, contacts (70, 71, 72) are deposited on the exposed contact surfaces 59a, 59b and on the third p-contact layer 52.

Figure 6A:
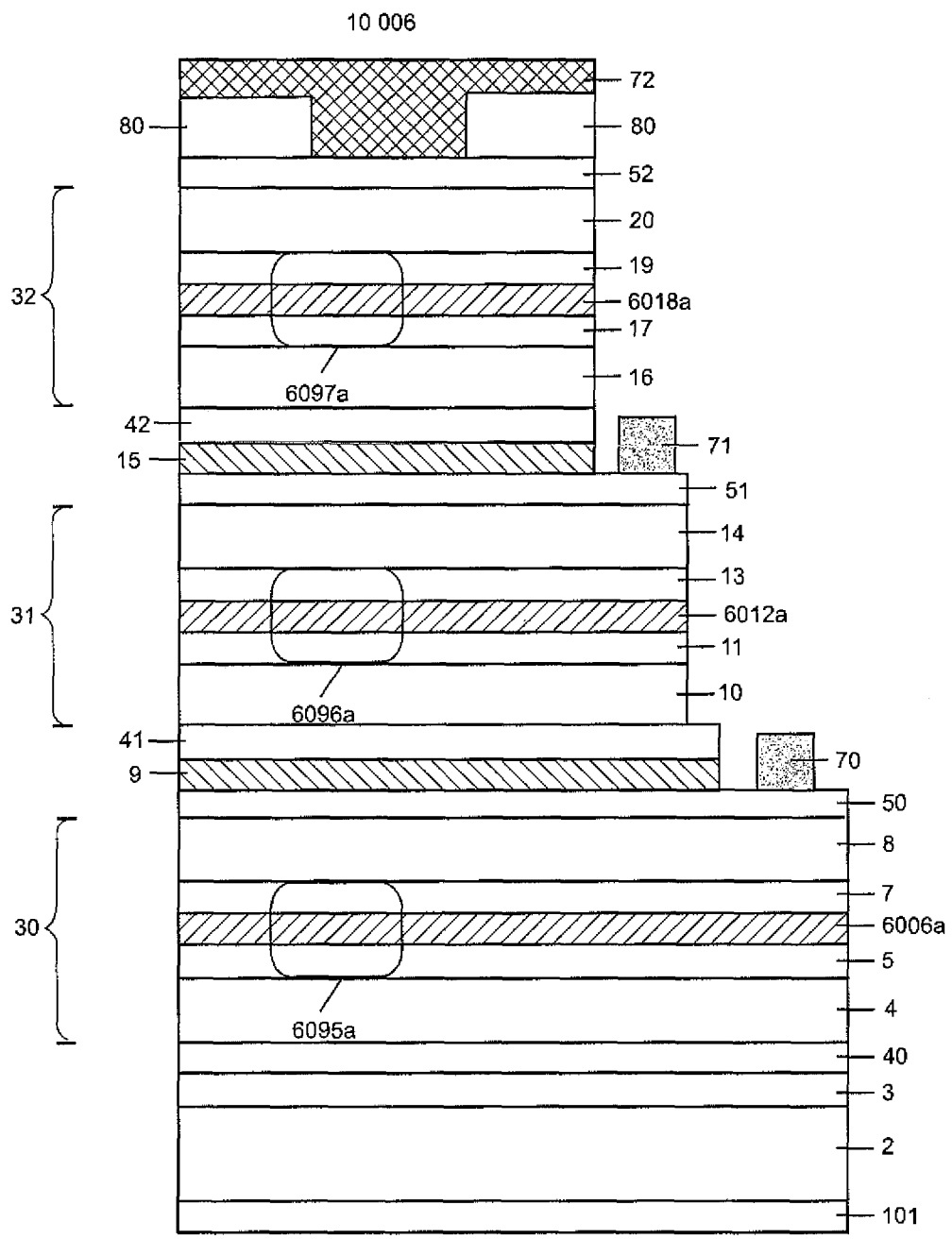
FIG. 6a shows an exemplary embodiment of a laser light source.

The end result of the first production process is illustrated in FIG. 6a.

Figure 2:
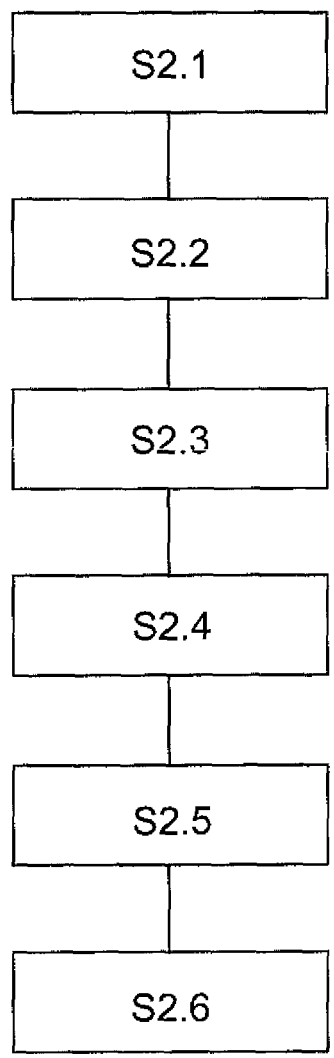
FIG. 2 shows the flowchart for a second production process.

FIG. 2 shows a second flowchart for producing a laser light source. The second production process can be subdivided into the steps S2.1 to S2.6.

In step S2.1, a semiconductor substrate 2 is provided with a buffer layer 3. A single light source is grown epitaxially thereon. The single light source comprises a laser stack 30, a first n-contact layer 40 and a first p-contact layer 50. In the growth direction the laser stack 30 consists of a first n-cladding layer 4, a first n-waveguide 5, a first active zone 6006a, a first p-waveguide 7 and a first p-cladding layer 8. A first insulation layer 55 is deposited on the first p-contact layer 50.

The result of step S2.1 is illustrated in FIG. 2.1.

In step 2.2, a partial region of the first p-contact layer 50 is covered with a first dielectric layer 53. In addition, the first insulation layer is exposed, whereby a recess 56 is formed in the first insulation layer 55.

The result of step S2.2 is illustrated in FIG. 2.2.

In step 2.3, a first tunnel diode 9 is grown. On this is grown a second single light source, comprising a laser stack 31 having a second active zone 6012a and having a second n-contact layer 41 and a second p-contact layer 51. On this is grown a second insulation layer 57. A partial region of the second p-contact layer 51 is covered with a second dielectric layer 54. In addition, the second insulation layer 57 is exposed, whereby a recess 58 is formed in the second insulation layer 57.

The result of step S2.3 is illustrated in FIG. 2.3.

In step 2.4, a second tunnel diode 15 is grown. On this is grown a third single light source. The single light source has a third laser stack 32 comprising a third n-cladding layer 16, a third n-waveguide 17, a third active zone 6018a, a third p-waveguide 19 and a third p-cladding layer 20. On this is deposited a third p-contact layer 52.

The result of step S2.4 is illustrated in FIG. 2.4.

In step S2.5, the first dielectric layer 53 and the second dielectric layer 54 are removed.

The result of step S2.5 is illustrated in FIG. 2.5, wherein can be seen the first exposed contact surface 59a and the second exposed contact surface 59b.

In step S2.6, contacts (70, 71, 72) are deposited on the exposed contact surfaces 59a, 59b and on the third p-contact layer 52.

Figure 6B:
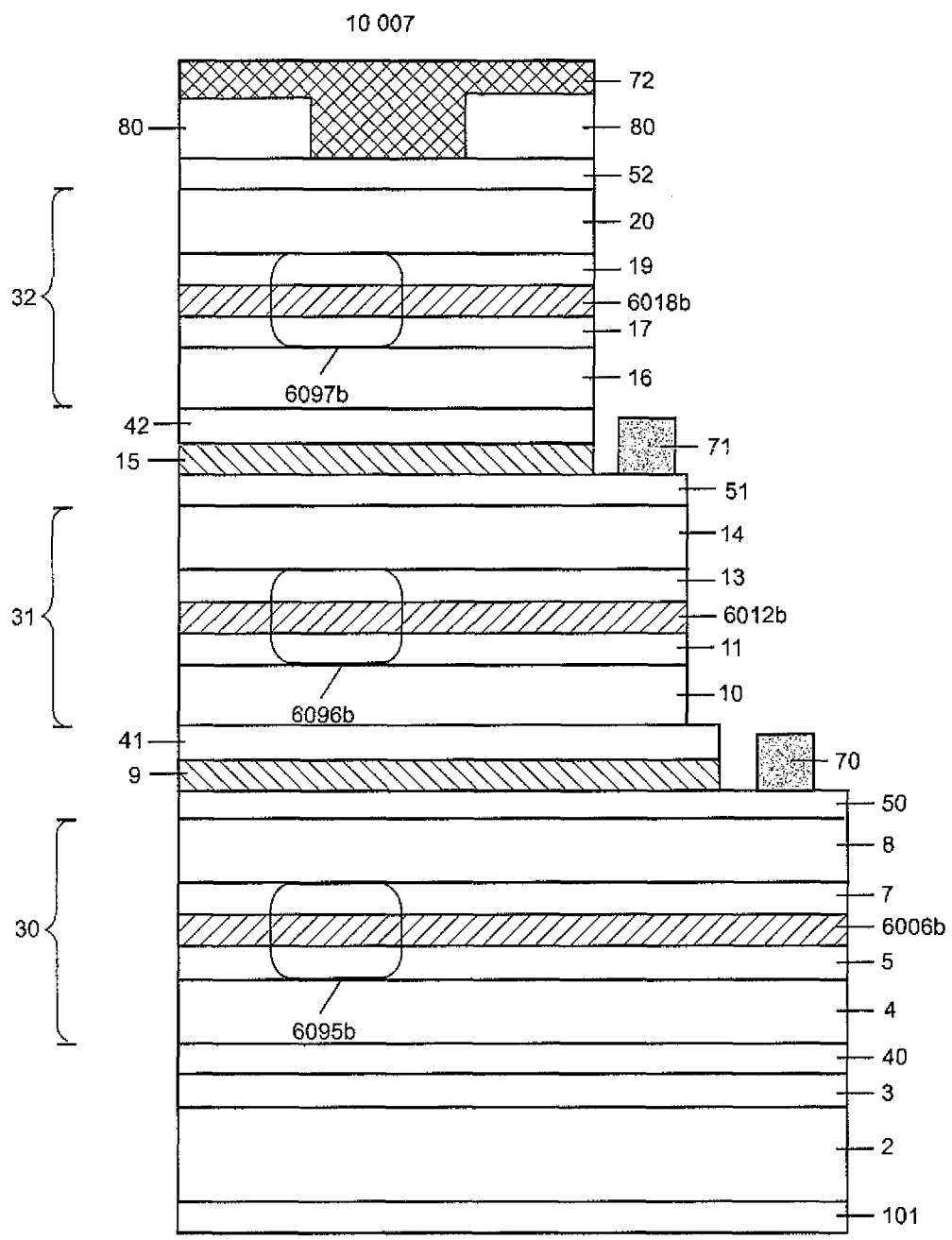
FIG. 6b shows an exemplary embodiment of a laser light source.
Figure 6C:
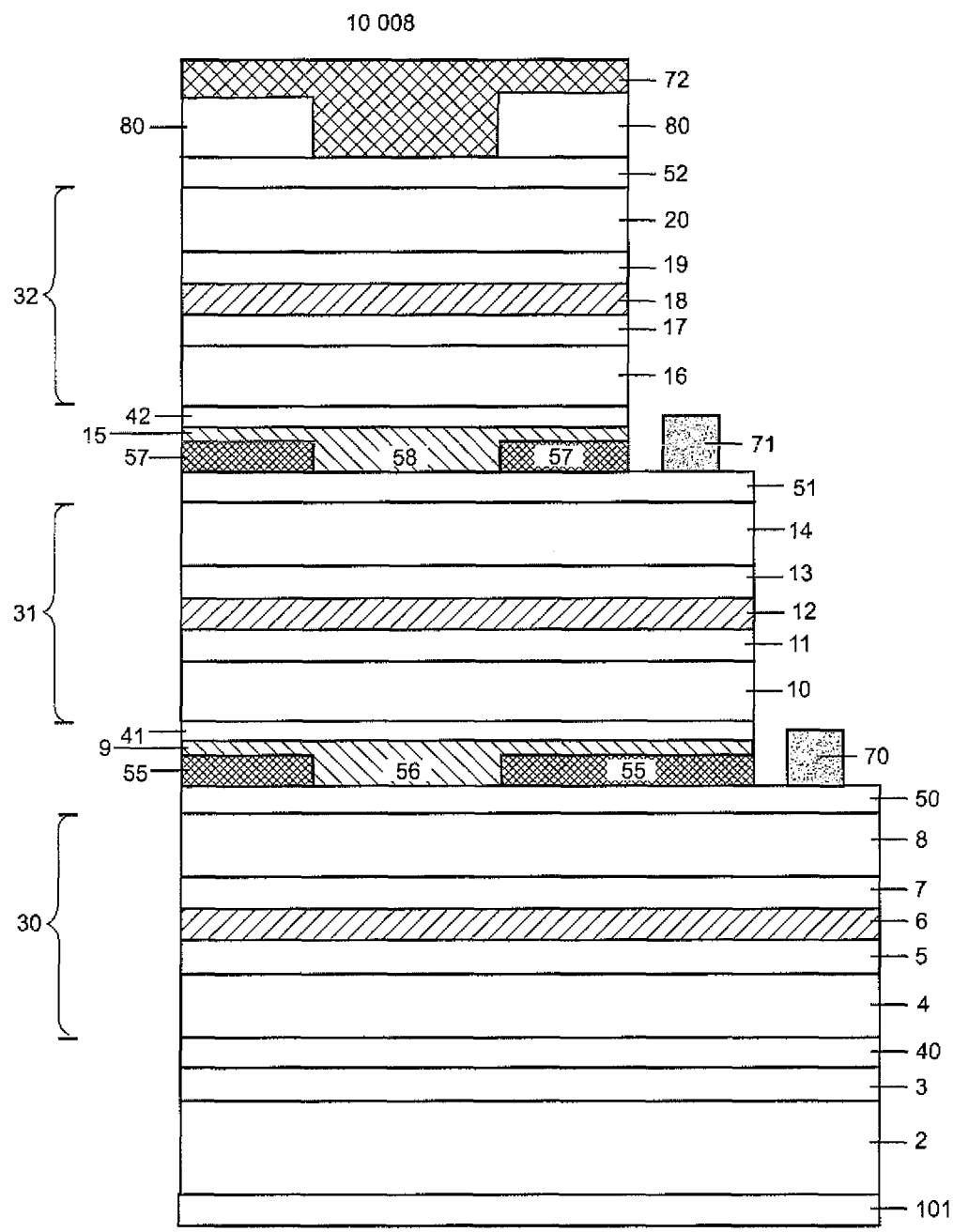
FIG. 6c shows an exemplary embodiment of a laser light source.

The end result of the second production process is illustrated in FIG. 6c.

Figure 3A:
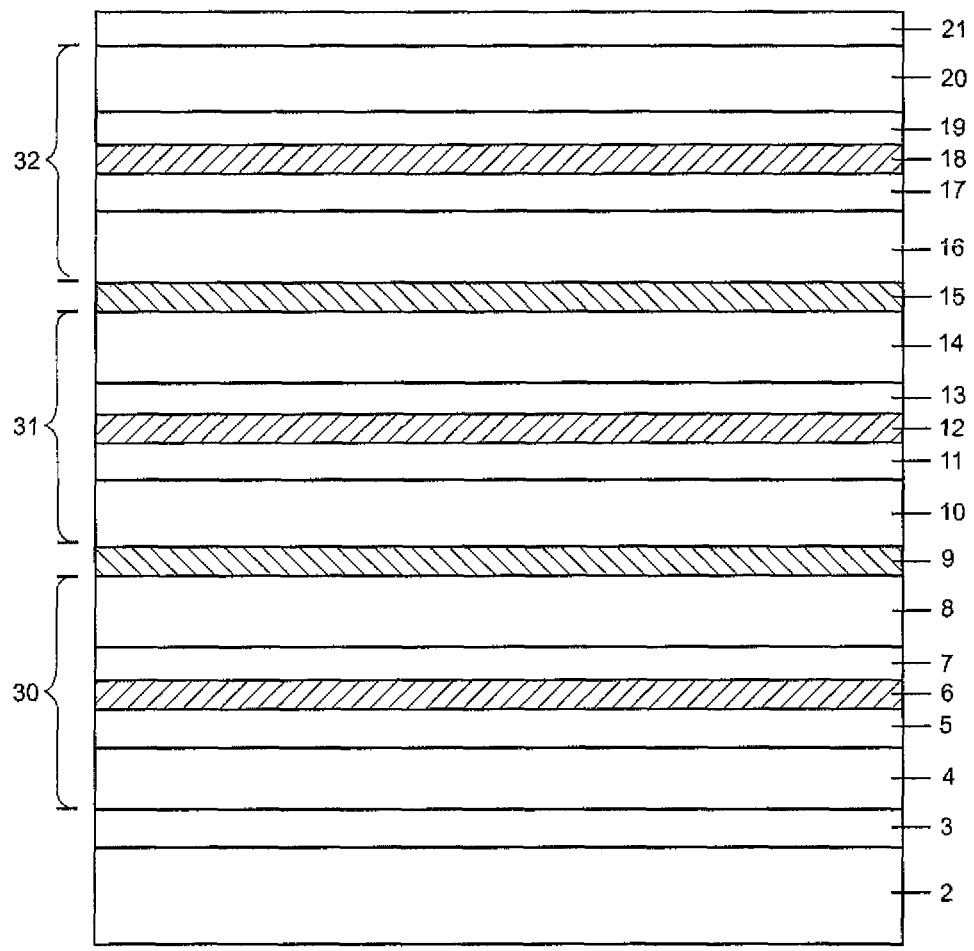
FIG. 3a shows a first exemplary embodiment of a layer sequence.

FIG. 3a shows an epitaxially grown layer sequence 1 wherein the tunnel diodes 9, 15 are arranged outside the cladding layers. This is a layer sequence having so-called conventional polarity. In the growth direction the n-doped semiconductor substrate 2 is followed by a buffer layer 3, a first n-cladding layer 4, a first n-waveguide 5, a first active zone 6, a first p-waveguide 7, a first p-cladding layer 8, a first tunnel diode 9, a second n-cladding layer 10, a second n-waveguide 11, a second active zone 12, a second p-waveguide 13, a second p-cladding layer 14, a second tunnel diode 15, a third n-cladding layer 16, a third n-waveguide 17, a third active zone 18, a third p-waveguide 19, a third p-cladding layer 20 and a p-contact layer 21. FIG. 1 furthermore shows three laser stacks 30, 31 and 32. Laser stack 30 comprises the first n-cladding layer 4, the first n-waveguide 5, the first active zone 6 for the emission of blue light, the first p-waveguide 7 and the first p-cladding layer 8. Laser stack 31 comprises the second n-cladding layer 10, the second n-waveguide 11, the second active zone 12 for the emission of green light, the second p-waveguide 13 and the second p-cladding layer 14. Laser stack 32 comprises the third n-cladding layer 16, the third n-waveguide 17, the third active zone 18 for the emission of red light, the third p-waveguide 19 and the third p-cladding layer 20.

Figure 3B:
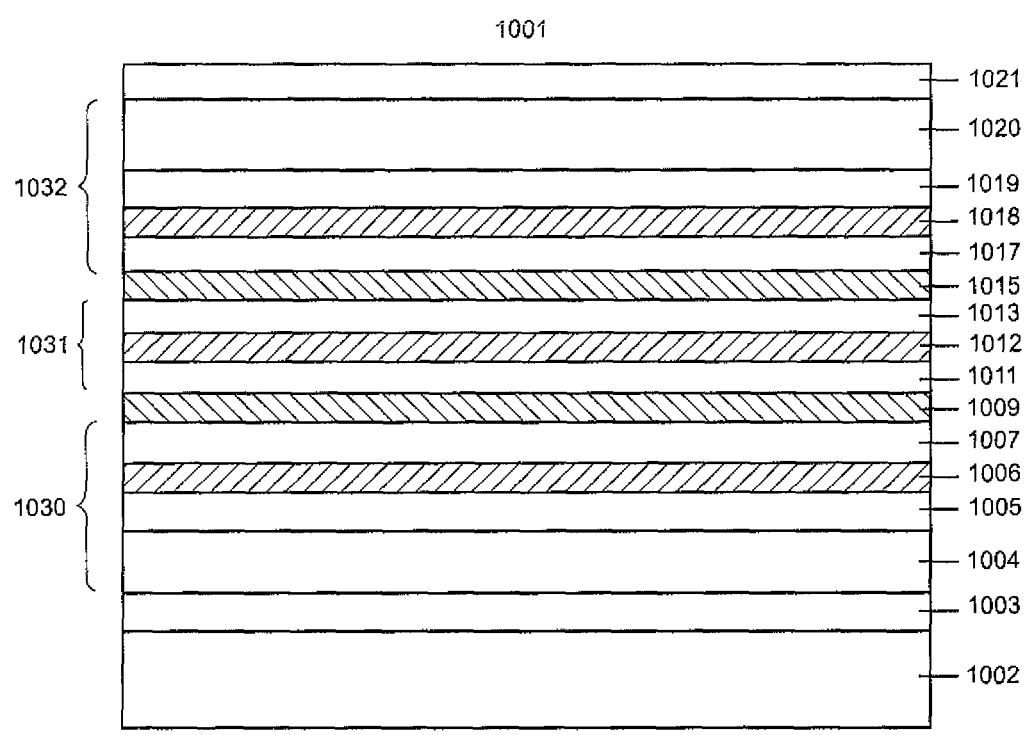
FIG. 3b shows an exemplary embodiment of a layer sequence.

FIG. 3b shows an epitaxially grown layer sequence 1001 wherein, in contrast to FIG. 1, the tunnel diodes 1009 and 1015 are arranged inside the cladding layers. As in the previous FIG. 3a, this is a layer sequence having conventional polarity. With regard to the laser diodes which are formed from the laser stacks 1030, 1031 and 1032, the p-waveguides 1007, 1013, 1019 adjoin the upper sides of the active zones 1006, 1012, 1018. In the growth direction the n-doped substrate 1002 is followed by a buffer layer 1003, an n-cladding layer 104, a first n-waveguide 1005, a first active zone 1006, a first p-waveguide 1007, a first tunnel diode 1009, a second n-waveguide 1011, a second active zone 1012, a second p-waveguide 1013, a second tunnel diode 1015, a third n-waveguide 1017, a third active zone 1018, a third p-waveguide 1019, a p-cladding layer 1020, a p-contact layer 1021.

A first laser stack 1030 comprises the n-cladding layer 1004, the first n-waveguide 1005, the first active zone 1006 and the first p-waveguide 1007. A second laser stack 1031 comprises the second n-waveguide 1011, the second active zone 1012 and the second p-waveguide 1013. A third laser stack 1032 comprises the third n-waveguide 1017, the third active zone 1018, the third p-waveguide 1019 and the p-cladding layer 1020. As a result of the fact that in FIG. 2 the tunnel diodes are arranged inside the cladding layers, the active zones are closer together. This enables the laser diode arrangement to have a lower height.

Figure 3C:
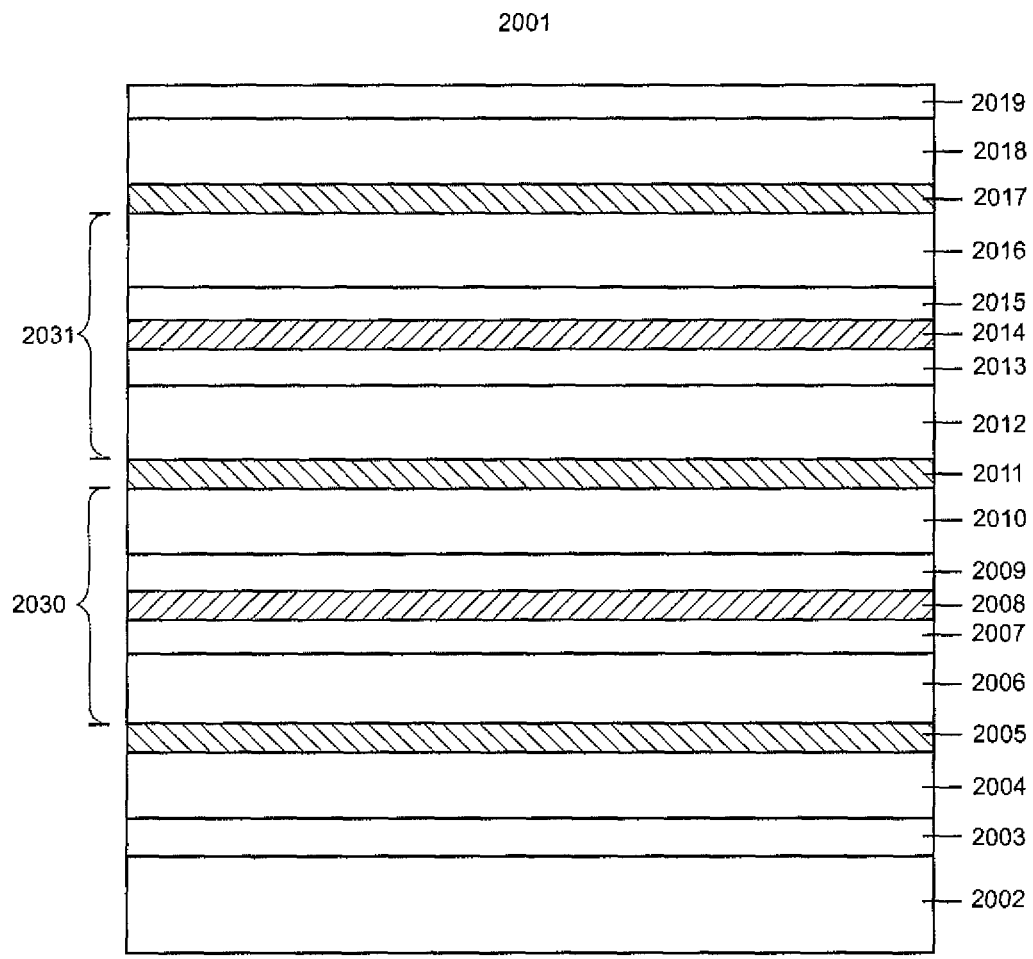
FIG. 3c shows an exemplary embodiment of a layer sequence.

FIG. 3c shows an epitaxially grown layer sequence 2001 wherein the tunnel diodes 2005 and 2011 are arranged outside the cladding layers. This is a layer sequence having inverted polarity. The layers facing the semiconductor substrate 2002, which layers adjoin the active zones 2008, 2014, are the p-waveguides 2007, 2013. The layers facing away from the semiconductor substrate 2002, which layers adjoin the active zones 2007, 2014, are the n-waveguides 2009, 2015. The layer sequence has a first laser stack 2030 and a second laser stack 2031. In the growth direction the semiconductor substrate 2002 is followed by a buffer layer 2003, a first n-cladding layer 2004, a first tunnel diode 2005, a first p-cladding layer 2006, a first p-waveguide 2007, a first active zone 2008, a first n-waveguide 2009, a second n-cladding layer 2010, a second tunnel diode 2011, a second p-cladding layer 2012, a second p-waveguide 2013, a second active zone 2014, a second n-waveguide 2015, a third n-cladding layer 2016, a third tunnel diode 2017, a third p-cladding layer 2018 and a p-contact layer 2019.

Figure 3D:
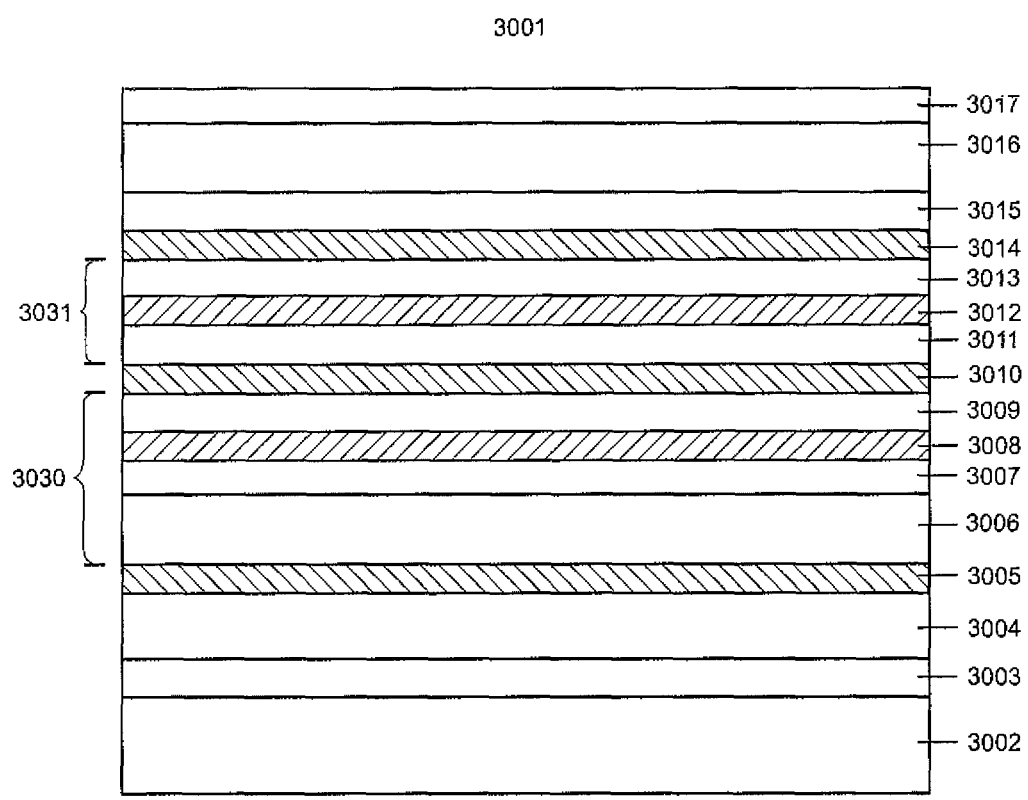
FIG. 3d shows an exemplary embodiment of a layer sequence.

FIG. 3d shows an epitaxially grown layer sequence 3001 wherein the first tunnel diode 3005 is arranged outside the cladding layers and wherein the second 3010 and the third 3014 tunnel diodes are arranged inside the cladding layers. As in the previous FIG. 3c, this is a layer sequence having inverted polarity. The first tunnel diode 3005 is an absolute necessity because the substrate 3002 is n-type. The layers facing the semiconductor substrate 3002, which layers adjoin the active zones 3008, 3012, are p-waveguides 3007, 3011. The layers facing away from the semiconductor substrate 3002, which layers adjoin the active zones 3008, 3012, are n-waveguides 3009, 3013.

In the growth direction the semiconductor substrate 3002 is followed by a buffer layer 3003, a first n-cladding layer 3004, a first tunnel diode 3005, a first p-cladding layer 3006, a first p-waveguide 3007, a first active zone 3008, a first n-waveguide 3009, a second tunnel diode 3010, a second p-waveguide 3011, a second active zone 3012, a second n-waveguide 3013, a second n-cladding layer 3016 and a p-contact layer 3017.

The first tunnel diode 3005 is necessary if the semiconductor substrate 3002 is n-type.

The layer sequence has a first laser stack 3030 and a second laser stack 3031.

Figure 3E:
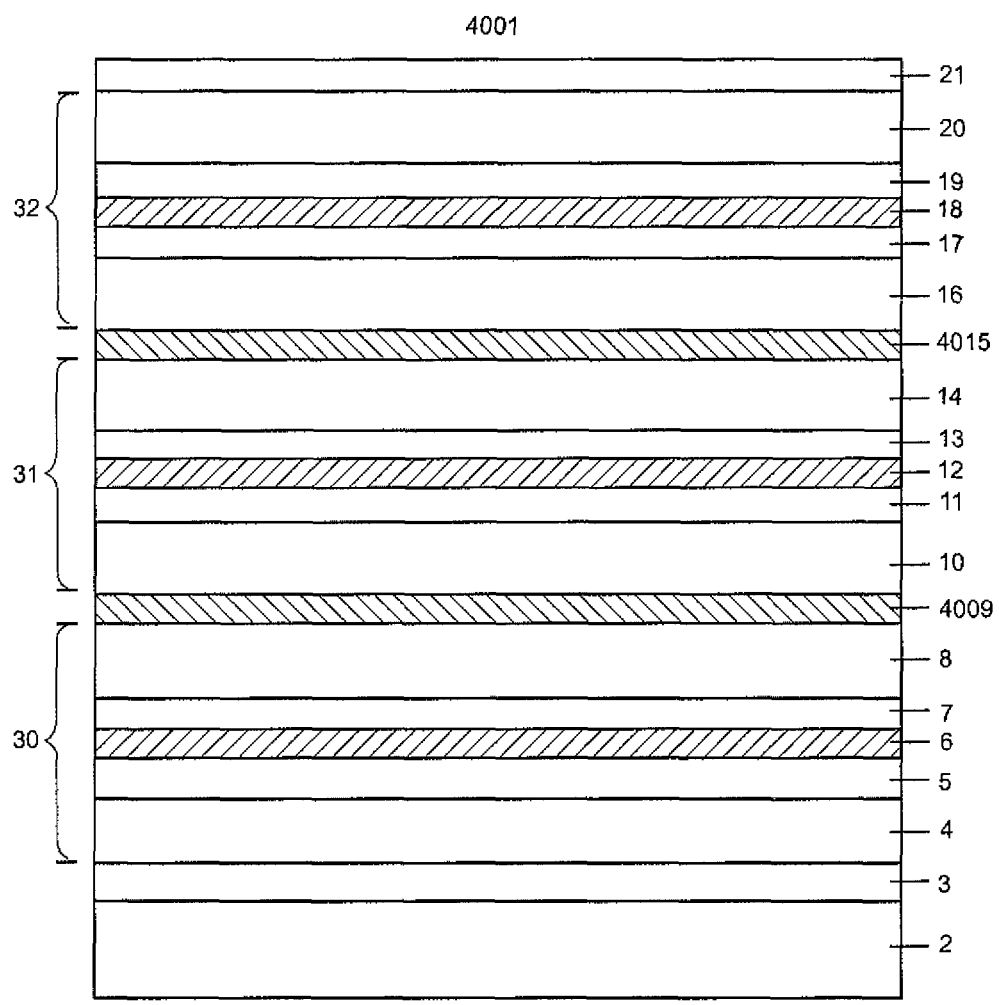
FIG. 3e shows an exemplary embodiment of a layer sequence.

FIG. 3e shows an epitaxially grown layer sequence 4001. The layer sequence is identical to the layer sequence 1001 in FIG. 3a except that crystalline electrically insulating layers 4009, 4015 are grown on as intermediate layers instead of the tunnel diodes 9, 15.

The exemplary embodiments illustrated in the following in FIGS. 4a, 5a, 5b, 6a, 6b, 6c, 7 are based on the layer sequence 1 from FIG. 3a. The exemplary embodiments illustrated in the following in FIGS. 4b, 4c, 8a, 8b and 8c are based on the layer sequence 4001 from FIG. 3e.

FIG. 3a shows, as already established above, the epitaxial layer sequence for conventional polarity. This means that in the case of the laser diodes which are formed from the laser stacks 30, 31 and 32 the p-sides adjoin the upper sides, in other words on the sides of the active zones 6, 12 and 18 facing away from the semiconductor substrate. The layers facing the semiconductor substrate 2 which adjoin the active zones 6, 12, 18 are n-waveguides 5, 11, 17. The layers facing away from the semiconductor substrate 2 which adjoin the active zones 6, 12, 18 are p-waveguides 7, 13, 19.

All the exemplary embodiments shown in FIGS. 4a to 8c are purely gain-guided laser diode arrangements. Effects identical or at least similar thereto can also be achieved in the case of purely index-guided or gain-guided and index-guided laser diode arrangements.

All the exemplary embodiments shown in FIGS. 4a to 8c are monolithically grown edge emitters. In the case of an edge emitter the laser resonator runs in a plane parallel to the substrate. The laser light is emitted from out of the drawing plane. Edge emitters can emit laser light at high power levels on account of their long resonator lengths of up to several 100 µm. Edge emitters are therefore particularly well suited for applications in laser projection arrangements. Dielectric mirrors or simply the front and rear surfaces of a laser stack can be used as laser mirrors. In the following exemplary embodiments, only arrangements are shown which use the front and rear surfaces of a laser stack as laser mirrors.

Figure 4A:
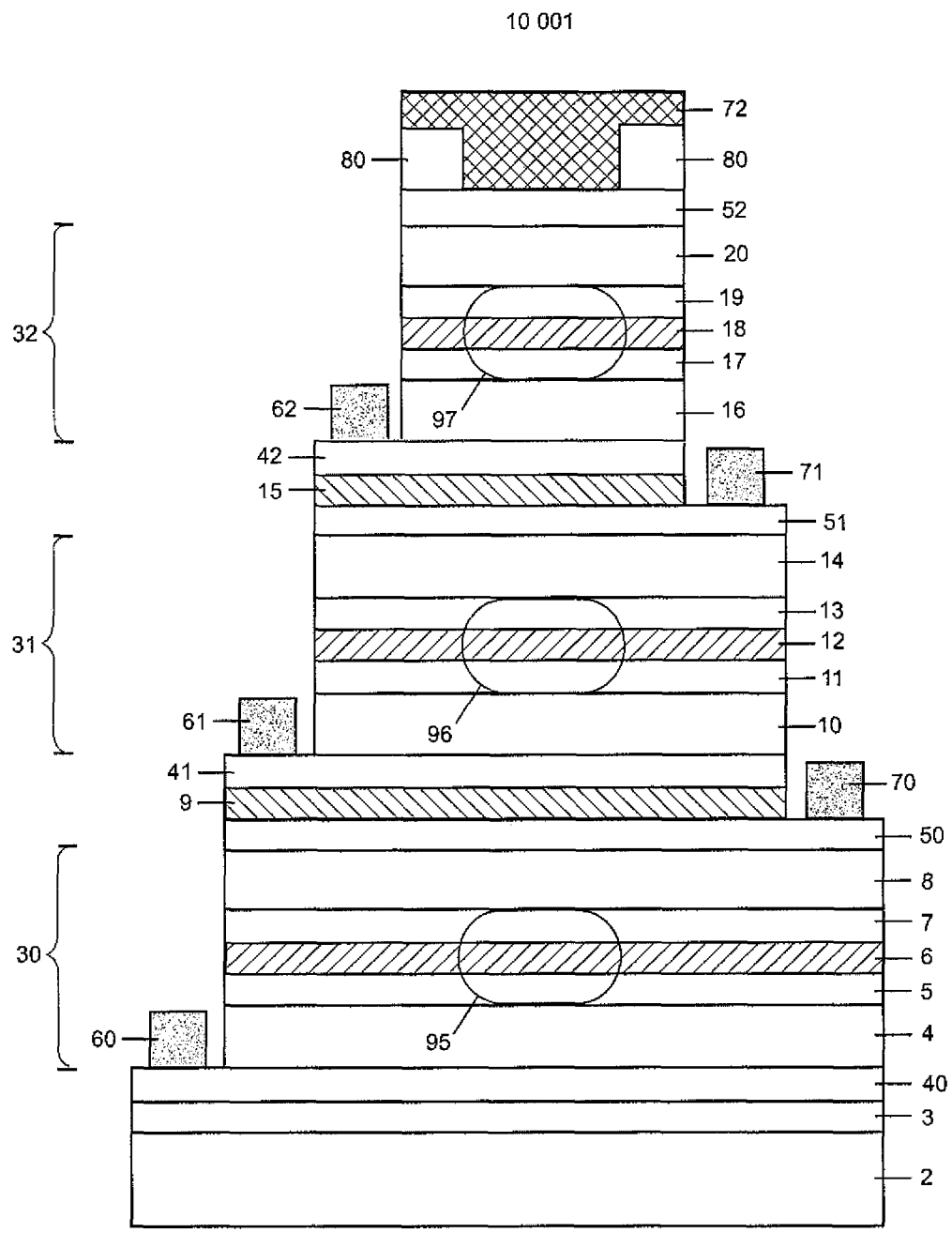
FIG. 4a shows an exemplary embodiment of a laser light source.

FIG. 4a shows an exemplary embodiment 10001 of a multi-color laser light source having individually actuatable active zones 6, 12, 18. The laser diode arrangement comprises a semiconductor substrate 2 having three laser stacks 30, 31, 32 each having an active zone 6, 12, 18 and having two intermediate layers 9, 15. The laser stacks 30, 31, 32 and the intermediate layers 9, 15 are grown monolithically on the semiconductor substrate 2. The intermediate layers 9, 15 are arranged between the laser stacks 30, 31, 32. The active zones 6, 12, 18 can be actuated separately from one another.

The active zones 6, 12, 18 are actuated by three separate n-contacts 60, 61, 62 and three separate p-contacts 70, 71, 72. The first n-contact 60 and the first p-contact 70 are used for separate contacting of the first, blue, active zone 6. The second n-contact 61 and the second p-contact 71 are used for separate contacting of the second, green, active zone 12. The third n-contact 62 and the third p-contact 72 are used for separate contacting of the third, red, active zone 18.

With its associated active zone 6, 12, 18, each laser stack 30, 31, 32 has laser diode 95, 96, 97. The first and the second intermediate layers are implemented by tunnel diodes 9, 15.

The active zones 6, 12, 18 are designed such that laser diodes 95, 96, 97 from different laser stacks 30, 31, 32 emit electromagnetic radiation in wavelength ranges differing from one another. The first active zone 6 is designed for the emission of blue laser light. The second active zone 12 is designed for the emission of green laser light. The third active zone 18 is designed for the emission of red laser light.

In order for example to individually actuate the green active zone 12, current is applied to the p-contact (71) for green and the n-contact (61) for green.

The first laser diode 95 emits in the blue spectral range, the second laser diode 96 emits in the green spectral range and the third laser diode 97 emits in the red spectral range. The active zone 6 for the emission of blue laser light is grown first so as not to negatively influence the higher In concentration of the active zone 12 for the emission of green laser light by the subsequent epitaxy steps.

The vertical spacing between the laser diodes 95, 96, 97 from different active zones 6, 12, 18 is less than about 20 µm, preferably less than about 5 µm and especially preferably less than about 2 µm.

Figure 4B:
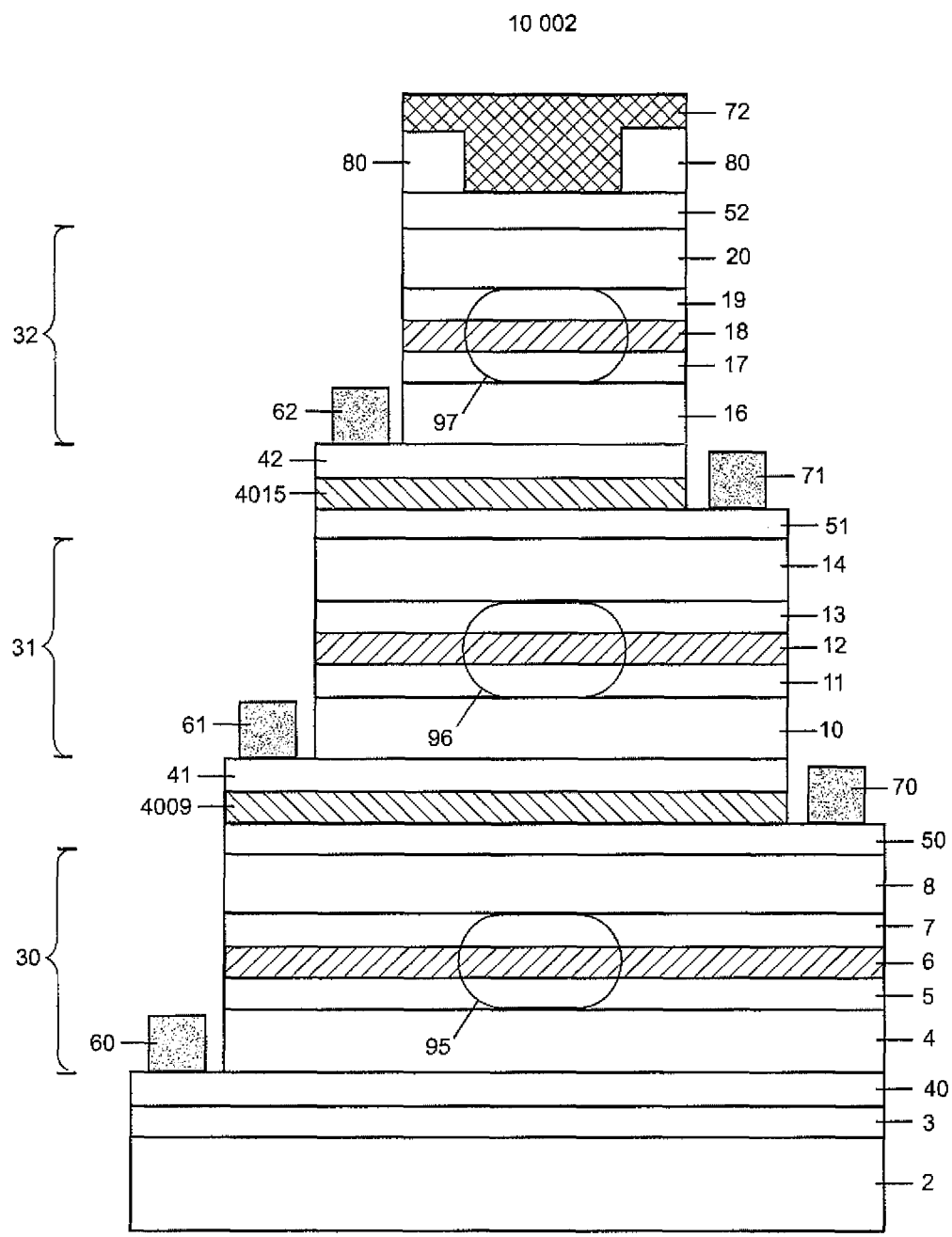
FIG. 4b shows an exemplary embodiment of a laser light source.

FIG. 4b shows an exemplary embodiment 10002 of a multi-color laser light source having individually actuatable active zones 6, 12, 18. The structure in FIG. 4b is identical to the structure in FIG. 4a except for the intermediate layers. The difference consists solely in that in FIG. 4b the intermediate layers 4009 and 4015 are designed as a crystalline electrically insulating layer. As an alternative to the above, epitaxially grown, insulating layer 4009, 4015 it is also possible to produce an insulating layer by means of ion implantation.

Beneath each of the n-cladding layers 4, 10 and 16 lies a respective n-contact layer 40, 41 and 42 with high n-doping. On these n-contact layers 40, 41 and 42 are deposited the three n-contacts 60, 61 and 62. A respective p-contact layer 50, 51 and 52 extends above each of the p-cladding layers B, 14 and 20. On these p-contact layers 50, 51 and 52 are deposited the three p-contacts 70, 71 and 72. In order to individually actuate the laser diode 95 for blue light, current is applied to the first n-contact 60 and the first p-contact 70. To individually actuate the laser diode 96 for green light, current is applied to the second n-contact 61 and the second p-contact 71. To individually actuate the laser diode 97 for red light, current is applied to the third n-contact 62 and the third p-contact 72.

Figure 4C:
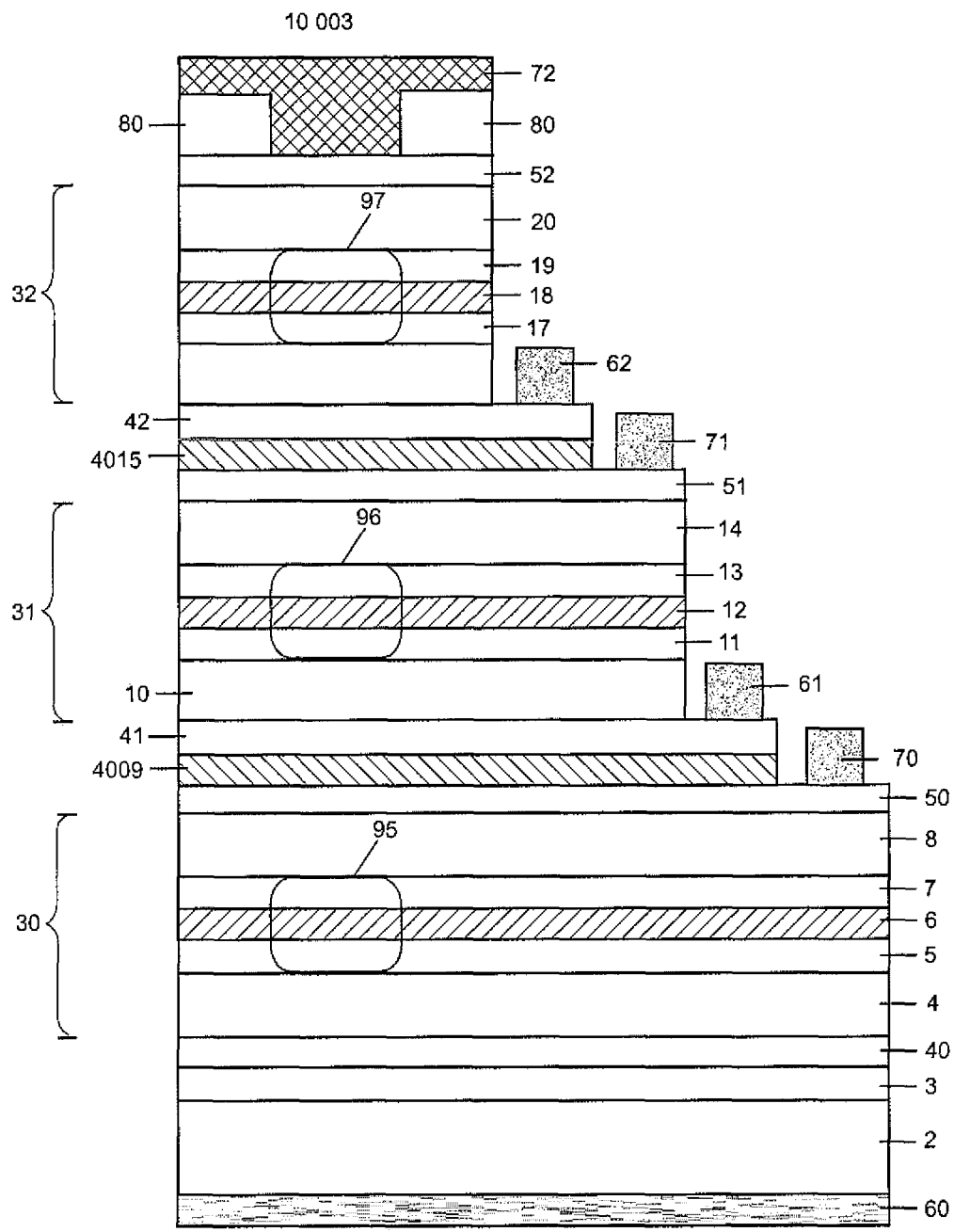
FIG. 4c shows an exemplary embodiment of a laser light source.

FIG. 4c shows a layer sequence identical to FIG. 4b, the only difference being the orientations of the contacts. In FIG. 4b the n-contacts 60, 61, 62 are situated on the opposite side of the layer stack in relation to the p-contacts 70, 71, 72. In FIG. 4c the n-contacts and the p-contacts are arranged on the same side of the layer stack. This configuration is particularly advantageous for placing two or more laser diode arrangements close to one another. The laser diodes 95, 96, 97 in turn emit in the blue, green and red spectral ranges.

Figure 5A:
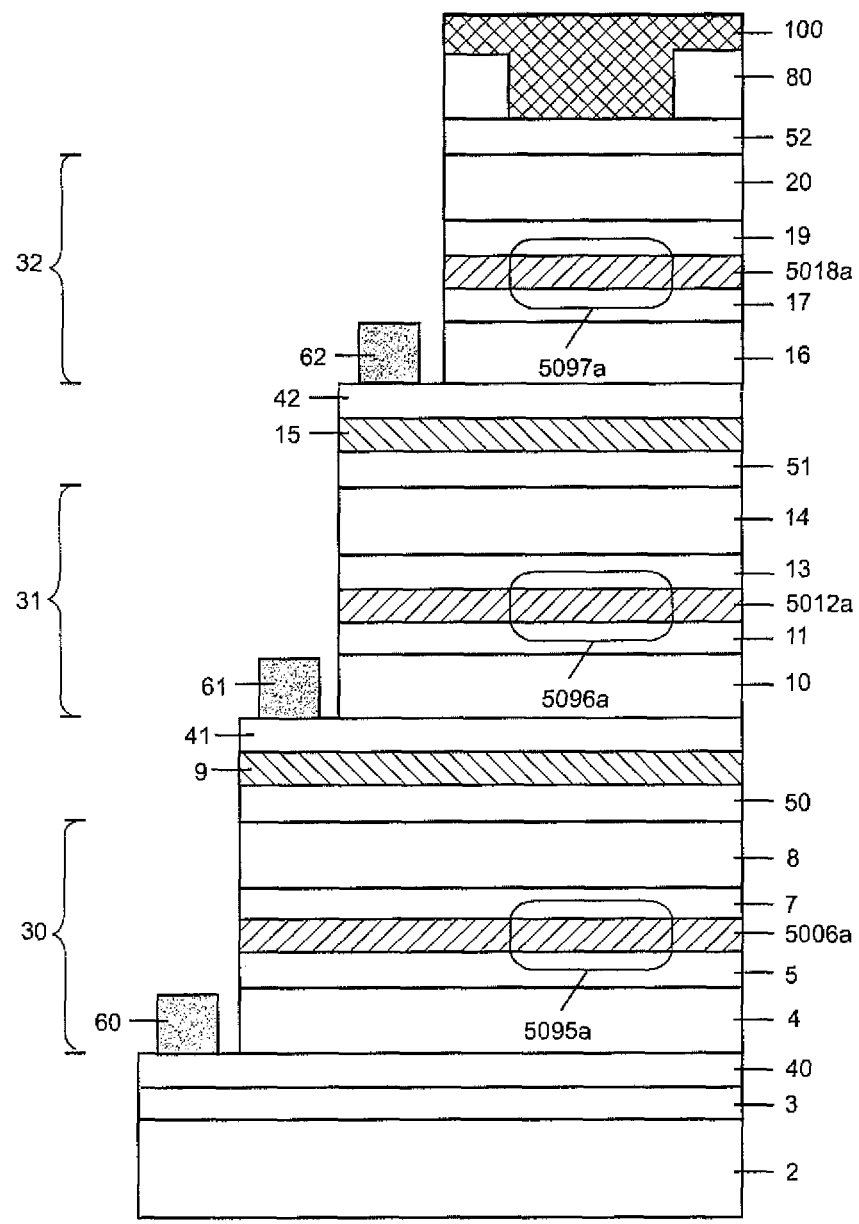
FIG. 5a shows an exemplary embodiment of a laser light source.

FIG. 5a shows an exemplary embodiment 10004 of a multi-color light source having individually actuatable active zones 5006a, 5012a, 5018a. A common p-contact 100 and individual n-contacts 60, 61 and 62 are provided for the emission of blue, green and red light. The first active zone 5006a is designed for the emission of blue laser light. The second active zone 5012a is designed for the emission of green laser light. The third active zone 5018a is designed for the emission of red laser light.

In order for example to actuate the green emitting laser diode 5096a, current is applied to the common p-contact 100 and the second n-contact 61. The red emitting laser diode 5097a does not light up if as a result of greater losses in the case of the red emitting laser diode 5097a the green emitting laser diode 5096a oscillates first. The losses are adjustable by way of the indium concentration in the active zones.

Figure 5B:
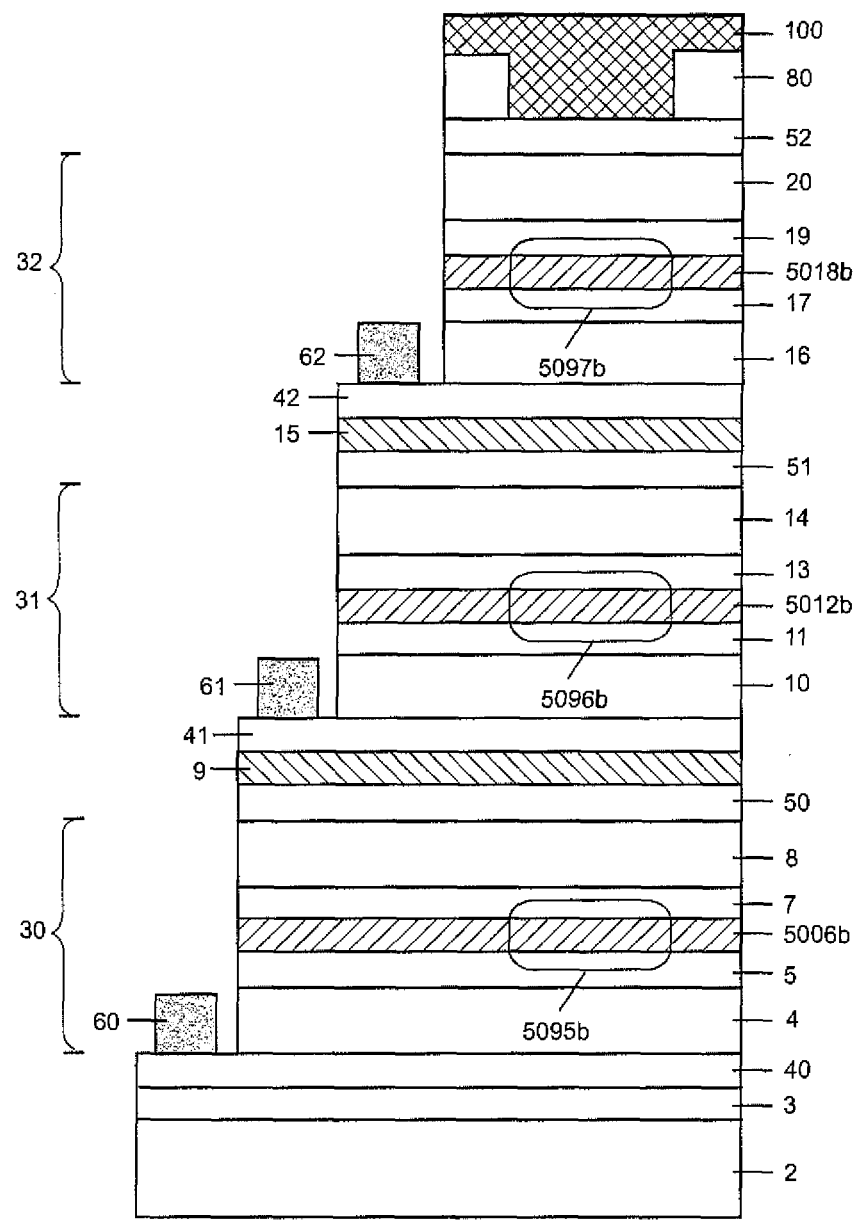
FIG. 5b shows an exemplary embodiment of a laser light source.

FIG. 5b shows an exemplary embodiment 10005. The arrangement is identical to FIG. 5a except that the sequence of the colors of the active zones 5006b, 5012b and 5018b has been changed. The first active zone 5006b is designed for the emission of red laser light. The second active zone 5012b is designed for the emission of green laser light. The third active zone 5018b is designed for the emission of blue laser light. A common p-contact 100 is also used in this exemplary embodiment.

In order for example to individually actuate the green active zone 5096b, current is applied to the n-contact 61 for green and the common p-contact 100. The blue laser diode 5097b does not light up because on account of the greater band gap of the blue laser diode 5097b the green laser diode 5096b oscillates first and begins to lase.

FIG. 6a shows an exemplary embodiment 10006 of a multi-color light source having individually actuatable active zones 6006a, 6012a, 6018a. A common n-contact 101 and individual p-contacts 70, 71 and 72 are provided. The n-contact 101 is connected to the underside of the substrate 2. The common n-contact 101 is preferably designed as a metallic conductor.

In order for example to actuate the green emitting laser diode 6096a, current is applied to the common n-contact 101 and the second p-contact 71. In this situation, the blue emitting laser diode 6095a would not oscillate because on account of the greater band gap the green emitting laser diode 6096a oscillates first and begins to lase.

FIG. 6b shows an exemplary embodiment 10007. It is identical to the arrangement in FIG. 6a except that the third active zone 6018b is designed for the emission of yellow light. As already illustrated in FIG. 6a, the first active zone 6006b is designed for the emission of blue laser light and the second active zone 6012b for the emission of green laser light.

FIG. 6c shows an exemplary embodiment 10008. It is based on the structure from FIG. 6a. FIG. 6c differs from FIG. 6a in that a first insulation layer 55 is grown on the first p-contact layer 50 and a second insulation layer 57 is grown on the second p-contact layer 51. A recess 56 is provided in the first insulation layer 55, and a recess 58 is provided in the second insulation layer 57. A first tunnel diode 9 is grown on the structure comprising first insulation layer 55 and recess 56. A second tunnel diode 15 is grown on the structure comprising second insulation layer 57 and recess 58. The insulating layers 55 and 57 with their respective recesses 56 and 58 are used for current constriction in the buried layers. On account of the current spreading inside the monolithic layer stack it can be advantageous to incorporate current constriction layers inside the monolithic layer stack in order to adjust the emission width of the single light sources based on the laser stacks 30, 31 and 32. This is prerequisite for operating the light source 10008 in monomode operation. In order to maintain clarity, no laser diodes have been drawn in FIG. 6c.

Figure 7:
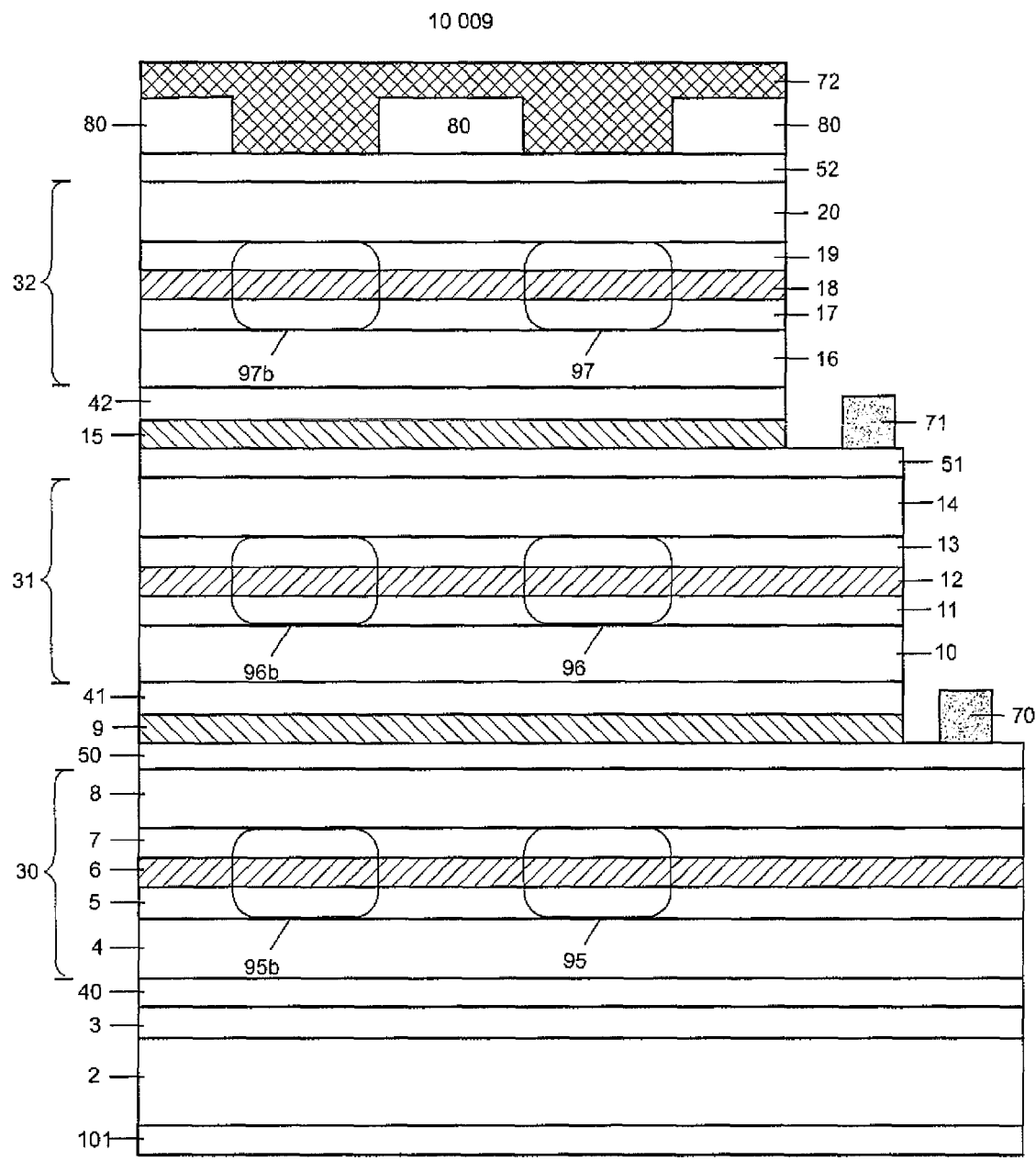
FIG. 7 shows an exemplary embodiment of a laser light source.

FIG. 7 shows an exemplary embodiment 10009 which is a multi-color light source having individually actuatable active zones 6, 12, 18. The exemplary embodiment shows a two-dimensional structure of the laser diodes. The laser diodes inside a laser stack 30, 31, 32 are actuated jointly. Two laser diodes are produced in each active zone by means of gain guidance. Blue emitting laser diodes 95 and 95b are formed from the first active zone 6. Green emitting laser diodes 96 and 96b are formed from the second active zone 12. Red emitting laser diodes 97 and 97b are formed from the third active zone. The two-dimensional laser diode structure enables a high optical power density whilst simultaneously reducing the loading on the facets. The laser diodes 95, 95b; 96, 96b; 97, 97b are moreover arranged horizontally, in other words parallel, with respect to the semiconductor substrate 2. The horizontal spacing between the laser diodes 95, 95b; 96, 96b; 97, 97b is less than about 100 µm, preferably less than about 20 µm and especially preferably less than about 5 µm. The geometric properties of the emission surface are also favorable. This permits the use of less complicated optical imaging systems, in other words for example a simple lens or a simple lens system. In addition, better imaging properties result. The formation of two or more laser diodes in an active zone is for example advantageous in order to take account of the sensitivity of the eye or other requirements. A second green laser diode 96b is primarily a possibility here. It is thereby also possible to balance the differing efficiency of laser diodes having different emission wavelengths.

Figure 8A:
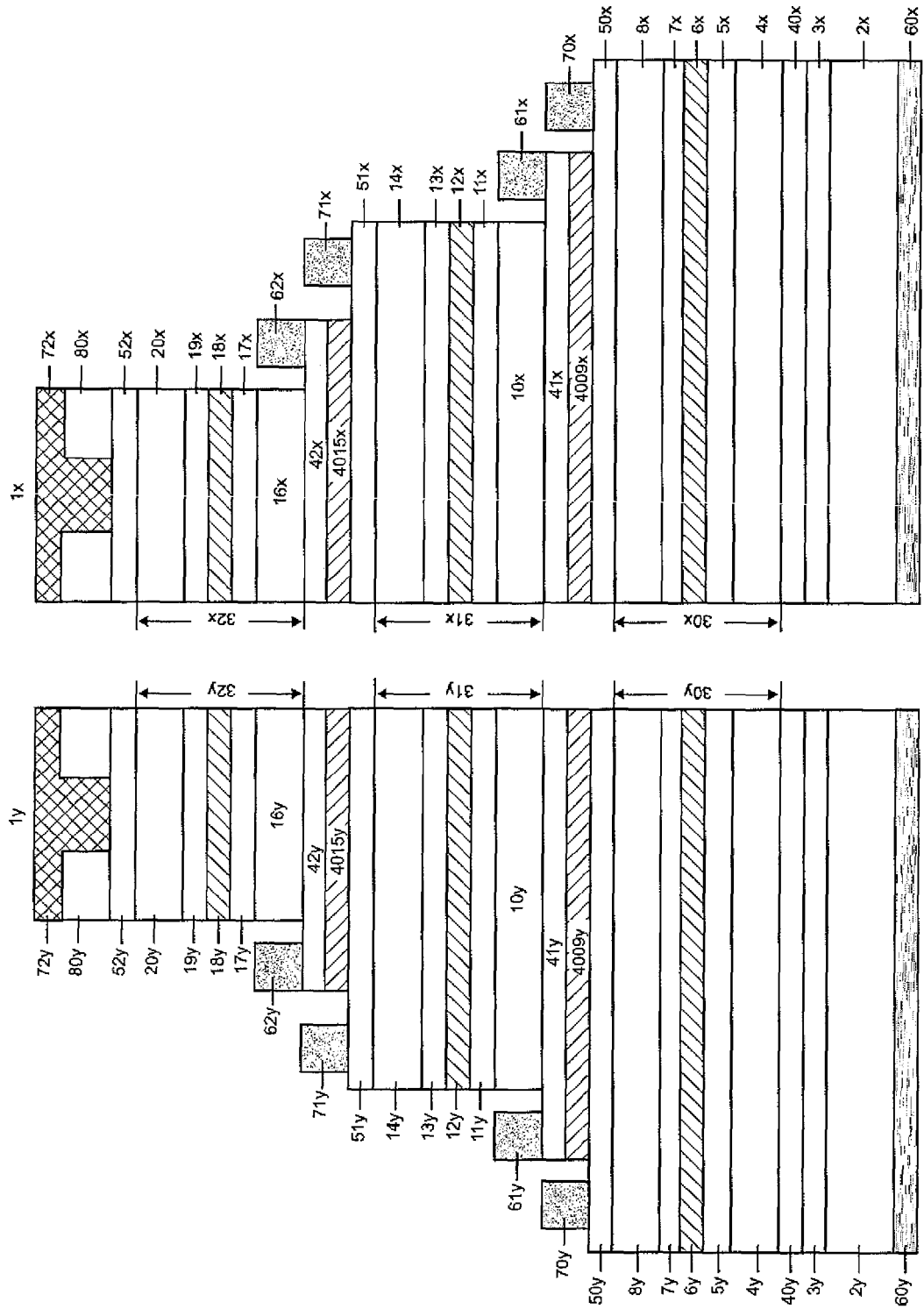
FIG. 8a shows an exemplary embodiment of a laser light source.

FIG. 8a shows an exemplary embodiment 10010 having a layer stack 1x and a layer stack 1y. The layer stack 1x is grown on a first semiconductor substrate 2x. The layer stack 1y is grown on a second semiconductor substrate 2y. The arrangement of the layers on each of the two semiconductor substrates 2x, 2y corresponds to that of the exemplary embodiment 10003 from FIG. 4c. Accordingly the n-contacts 61x and 62x and the p-contacts 70x, 71x of the layer stack 1x are arranged on one and the same side. The first n-contact 60x is deposited on the side of the semiconductor substrate 2x facing away from the layer stack 1x. The third p-contact 72x completes the top of the layer stack 1x.

The n-contacts 61y and 62y and the p-contacts 70y, 71y of the layer stack 1y are likewise arranged on one and the same side. The first n-contact 60x is deposited on the side of the semiconductor substrate 2y facing away from the layer stack 1y. The third p-contact 72y completes the top of the layer stack 1y.

GaN, AlN, InN or Si come into consideration as the first semiconductor substrate 2x.

GaAs, GaP or Si come into consideration as the second semiconductor substrate 2y.

A layer stack based on the AlInGaN material system is grown on the first semiconductor substrate 2x. By preference, the first active zone 6x is designed for the emission of blue laser light, the second active zone 12x for the emission of cyan colored laser light and the third active zone 18x for the emission of green laser light.

A layer stack based on the AlInGaP material system is grown on the second semiconductor substrate 2y. By preference, the first active zone 6y is designed for the emission of yellow laser light, the second active zone 12y for the emission of amber colored laser light and the third active zone 18y for the emission of red laser light.

As a result of the configuration described above, the two monolithic layer stacks 1x and 1y can be arranged close to one another such that they exhibit a spacing in the region of a few µm. In this situation, the contacts 61x, 62x, 70x, 71x of the layer stack 1x point in the opposite direction to the contacts 61y, 62y, 70y, 71y.

This configuration produces minimally spaced laser diodes. Spacings in the region of less than about 50 µm, preferably less than about 10 µm, especially preferably about 2 µm can be implemented. This holds true on the one hand for laser diodes inside the first layer stack 1x and inside the second layer stack 1y. But the above spacings in the µm range also hold true for the spacings between laser diodes from the first layer stack 1x and the second layer stack 1y. It is thereby possible to achieve an optimum projection with minimal imaging errors. A simple lens system is moreover sufficient. By growing or arranging more than three single light sources each having an active zone 6x, 12x, 18x, 6y, 12y, 18y, in other words for example as described above, blue, cyan, green, yellow, amber and red, it is possible to enlarge the color space to be mapped. In order to maintain clarity, no laser diodes have been drawn in FIG. 8a.

Figure 8B:
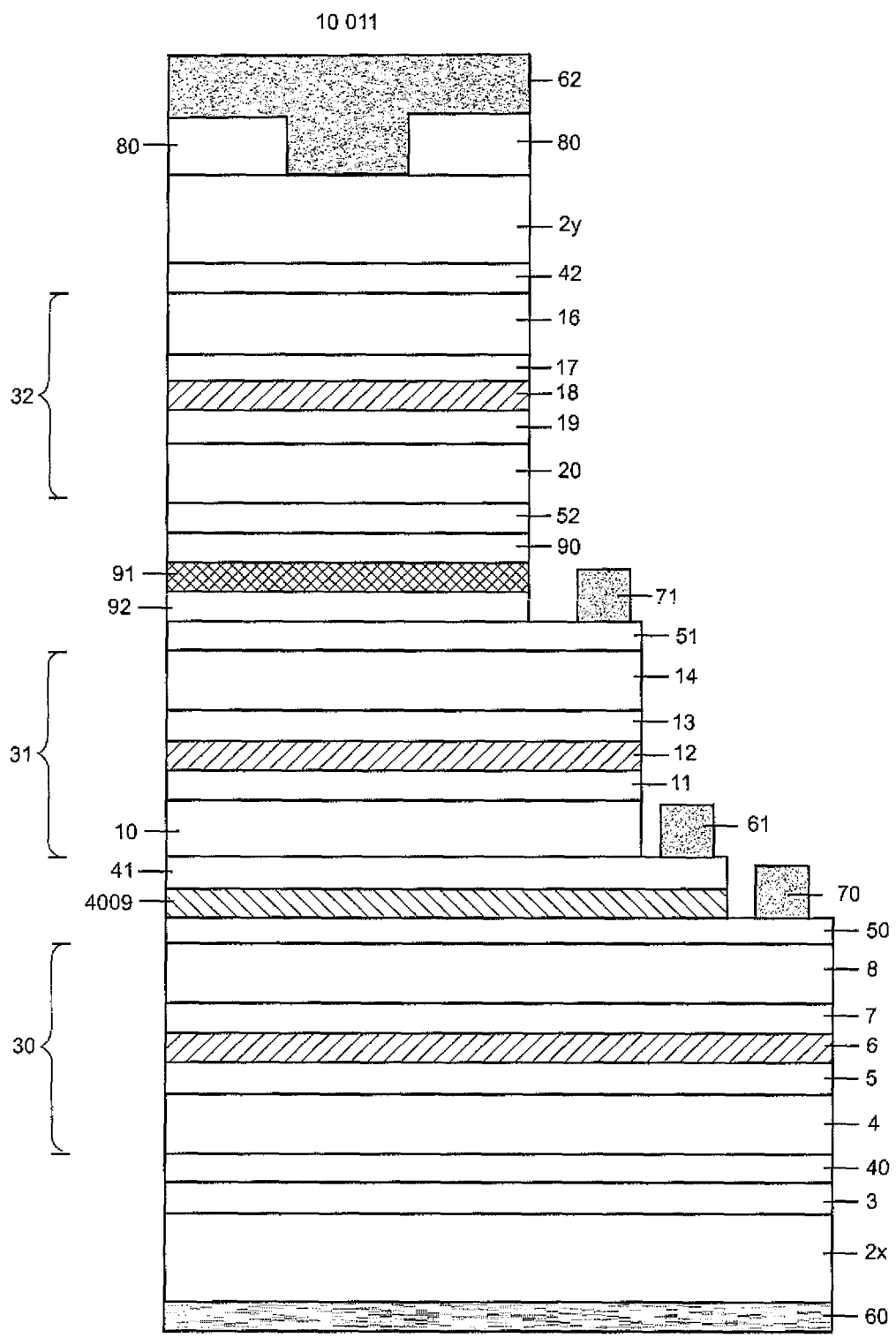
FIG. 8b shows an exemplary embodiment of a laser light source.

FIG. 8b shows an exemplary embodiment 10011 having a first semiconductor substrate 2x and a second semiconductor substrate 2y. A first laser stack 30 having an active zone 6 which is designed to emit blue laser light is grown on the first semiconductor substrate 2x. On this is grown a crystalline, electrically insulating layer 4009. Above this is grown a second laser stack 31 having an active zone 12 which is designed to emit green laser light. Grown directly onto the second laser stack 31A is second p-contact layer 51. Deposited thereon is a first p-metallization 92. A solder layer 91 creates the connection to a red single emitter which has been grown separately from the first substrate 2x on the second substrate 2y. This red single emitter is connected by way of a second p-metallization 90 with the solder layer 91. In other words, the red single emitter with the epitaxy layers, such as p-contact layer 52, p-cladding layer 20, p-waveguide 19, active zone for the emission of red light 18, n-waveguide 17, n-cladding layer 16, n-contact layer 42 and second substrate 2y is connected face-down with the layers grown on the first substrate 2x. A passivation layer 80 and a third n-contact 62 are deposited on the second substrate 2y.

The advantage of the arrangement 10011 consists in the following. The active zone 6 for the emission of blue laser light and the active zone 12 for the emission of green laser light can be grown simply and cost-effectively on the first substrate 2x, for example GaN. The active zone 18 for the emission of red laser light can be grown particularly simply and cost-effectively on the second substrate 2y, for example GaAs. Only after the epitaxial growth has taken place are the two monolithic layer stacks connected to one another in electrically conducting fashion and mechanically by means of the metallization layers 92 and 90 and by means of a solder layer 91. A third p-contact 72 is dispensed with in this situation. Current is also applied to the p-side of the "red" layer stack by way of the second p-contact 71.

The first p-metallization 92 comprises an alloy of Ti, Pt and Au. Titanium is used here as an adhesion agent. Platinum is used as a diffusion barrier. The solder 91 comprises AnSn or In. In order to maintain clarity, no laser diodes have been drawn in FIG. 8b.

A further advantage of the "face-down" structure, in particular in the case of power lasers, is the improved heat dissipation.

Figure 8C:
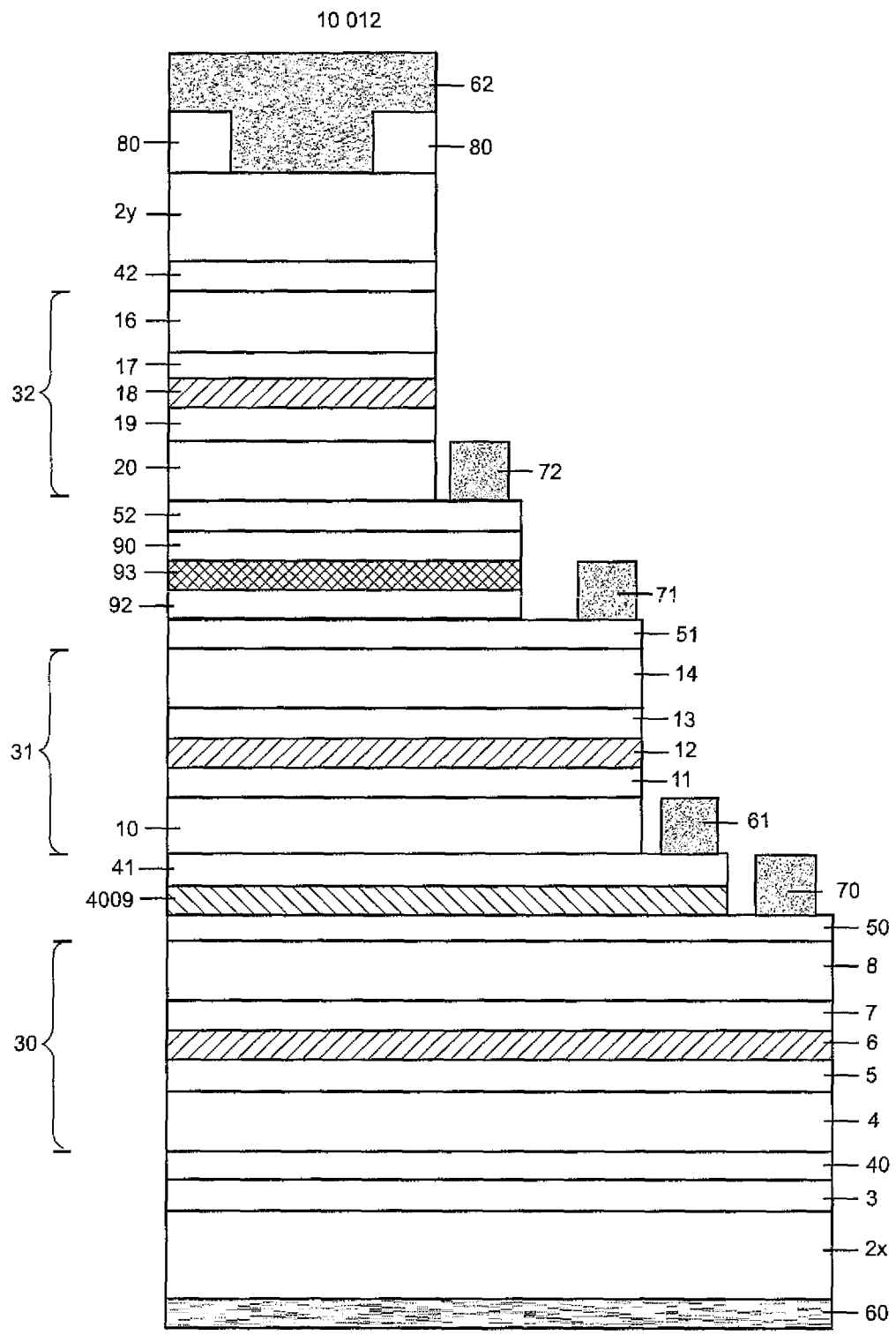
FIG. 8c shows an exemplary embodiment of a laser light source.

FIG. 8c shows an exemplary embodiment 10012 having a first semiconductor substrate 2x and a second semiconductor substrate 2y. The arrangement is identical to the arrangement from FIG. 8b except that an insulation layer 93 and a separate third p-contact 72 are provided instead of the solder layer 91. This separate p-contact 72 is required because the insulation layer 93 is arranged between the p-metallization layer 92 for the layer stack 31 and the p-metallization layer 90 for the layer stack 32. The p-metallization 92 is optional and can be used for additional current injection. The insulation layer 93 has a thickness between about 50 μm and 200 μm, preferably about 100 μm. In order to maintain clarity, no laser diodes have been drawn in FIG. 8c.

The laser diode arrangement and the method for producing a laser diode arrangement have been described by way of illustration of the underlying idea with reference to several exemplary embodiments. The exemplary embodiments are not restricted here to particular combinations of features. Even though several features and implementations have been described only in conjunction with a specific exemplary embodiment or individual exemplary embodiments, in each case they can be combined with other features from other exemplary embodiments. It is likewise conceivable to omit or add individual described features or specific implementations in exemplary embodiments, insofar as the general technical teaching remains implemented.

Even though the steps of the method for producing a laser diode arrangement are described in a particular sequence, it is then understood that each of the methods described in this disclosure can be carried out in any other meaningful sequence, whereby method steps can also be omitted or added, insofar as no deviation occurs from the fundamental idea of the described technical teaching.

The invention claimed is:

1. A method for producing a laser diode arrangement, comprising:
    providing a semiconductor substrate;
    epitaxially growing a first single light source, comprising a first laser stack having an active zone, a first n-contact layer and a first p-contact layer;
    depositing a first dielectric layer on a partial region of the first p-contact layer;
    epitaxially growing an intermediate layer on the first p-contact layer;
    epitaxially growing at least one second single light source, comprising a second laser stack having an active zone, a second n-contact layer and a second p-contact layer;
    depositing a second dielectric layer on a partial region of the second p-contact layer;
    removing the at least two dielectric layers by means of etching or lift-off in order to expose contact surfaces;
    depositing contacts on the exposed contact surfaces and on the exposed contact layer furthest away from the substrate.

2. The method of claim 1, wherein after the step of growing a single light source and before the step of depositing a dielectric layer on a partial region of the p-contact layer the following steps are carried out:
    growing an insulation layer on the contact layer; and
    exposing the insulation layer by etching or lift-off.

3. The method of claim 1, wherein separate actuation of the active zones by separate n-contacts is provided.

4. The method of claim 3, wherein separate actuation of the active zones by a common p-contact is provided.

5. The method of claim 1, wherein separate actuation of the active zones by separate p-contacts is provided.

6. The method of claim 5, wherein separate actuation of the active zones by a common n-contact is provided.

7. The method of claim 1 wherein each laser stack with the associated active zone has at least one laser diode.

8. The method of claim 1, wherein the intermediate layer has a tunnel diode having a low ohmic resistance.

9. The method of claim 1, wherein the intermediate layer has an insulator, in particular a crystalline electrically insulating layer.

10. The method of claim 7, wherein the active zones are designed such that laser diodes from different laser stacks emit electromagnetic radiation in wavelength ranges differing from one another.

11. The method of claim 1, wherein the laser diode arrangement has at least two light sources, formed from the laser stacks, wherein at least one laser stack is monolithically grown on a second semiconductor substrate.

12. The method of claim 7, wherein the vertical spacing between the laser beams emitted from the laser diodes is less than about 20 μm.

13. The method of claim 1, wherein a layer facing the semiconductor substrate, which layer adjoins the active zone, is an n-waveguide and a layer facing away from the semiconductor substrate, which layer adjoins the active zone, is a p-waveguide.

14. The method of claim 7, wherein the vertical spacing between the laser beams emitted from the laser diodes is less than about 5 μm.

15. The method of claim 7, wherein the vertical spacing between the laser beams emitted from the laser diodes is less than about 2 μm.

* * * * *